United States Patent
Toros et al.

(10) Patent No.: US 7,323,671 B1
(45) Date of Patent: Jan. 29, 2008

(54) METHOD AND APPARATUS FOR VARYING A CMOS SENSOR CONTROL VOLTAGE

(75) Inventors: Zeynep Toros, Aliso Viejo, CA (US); Richard Mann, Torrance, CA (US); Selim Bencuya, Irvine, CA (US); Chi-Shao (Sergi) Lin, Mission Viejo, CA (US); Jiafu Luo, Irvine, CA (US)

(73) Assignee: ESS Technology, Inc., Fremont, CA (US)

( * ) Notice: Subject to any disclaimer, the term of this patent is extended or adjusted under 35 U.S.C. 154(b) by 158 days.

(21) Appl. No.: 11/029,103

(22) Filed: Dec. 30, 2004

(51) Int. Cl.
H01L 27/00 (2006.01)
G01J 1/44 (2006.01)
H03F 3/08 (2006.01)
H01J 40/14 (2006.01)

(52) U.S. Cl. .............................. 250/208.1; 250/214 R; 257/291; 348/302

(58) Field of Classification Search .............. 250/208.1, 250/214 R, 214.1; 257/291, 292, 461, 462; 348/302, 308
See application file for complete search history.

(56) References Cited

U.S. PATENT DOCUMENTS

| | | | |
|---|---|---|---|
| 5,835,141 A | 11/1998 | Ackland et al. | |
| 6,630,701 B1 | 10/2003 | Rhodes | |
| 6,809,358 B2 | 10/2004 | Hsieh et al. | |
| 6,815,743 B2 | 11/2004 | Rhodes | |
| 6,825,878 B1 | 11/2004 | Rhodes | |
| 6,919,549 B2 * | 7/2005 | Bamji et al. ............. | 250/208.1 |
| 2002/0008767 A1 | 1/2002 | Lee | |
| 2003/0193597 A1 | 10/2003 | Fossum et al. | |
| 2004/0053436 A1 | 3/2004 | Rhodes | |
| 2004/0094784 A1 | 5/2004 | Rhodes et al. | |
| 2004/0135209 A1 | 7/2004 | Hsieh et al. | |
| 2004/0173799 A1 | 9/2004 | Patrick | |
| 2004/0188727 A1 | 9/2004 | Patrick | |
| 2005/0248673 A1 * | 11/2005 | Fowler ....................... | 348/308 |

OTHER PUBLICATIONS

Ikuko Inoue et al. "New LV-BPD (Low Voltage Buried Photo-Diode) for CMOS Imager" IEEE 1999 pp. 883-886.
Abbas El Gamal "Trends in CMOS Image Sensor Technology and Design" International Electron Devices Meeting Digest of Technical Papers, Dec. 2002 consisting of 4 pages.
Pierre Magnan "Detection of Visible Photons in CCD and CMOS: A Comparative View", Nuclear Instruments and Methods in Physics Research A 504 (2003) pp. 199-212.
H. Rhodes et al. "CMOS Imager Technology Shrinks and Image Performance" IEEE 2004, pp. 7-18.
Yasuyuki Endo et al. "4-micron Pixel CMOS Image Sensor With Low Image Lag and High-Temperature Operability", Sensors and Camera Systems for Scientific, Industrial, and Digital Photography Applications IV, SPIE vol. 5017 (2003), pp. 196-204.

(Continued)

*Primary Examiner*—Georgia Epps
*Assistant Examiner*—Patrick J. Lee
(74) *Attorney, Agent, or Firm*—Kenta Suzue Haynes Beffel & Wolfeld LLP

(57) ABSTRACT

An improved CMOS sensor integrated circuit is disclosed, along with methods of making the circuit and computer readable descriptions of the circuit.

26 Claims, 29 Drawing Sheets
(1 of 29 Drawing Sheet(s) Filed in Color)

OTHER PUBLICATIONS

Keiji Mabuchi et al. "CMOS Image Sensors Comprised of Floating Diffusion Driving Pixels With Buried Photodiode" IEEE Journal of Solid-State Circuits, vol. 39, No. 12, Dec. 2004, pp. 2408-2416.

U.S. Appl. No. 10/732,583, filed Dec. 10, 2003, entitled "Device and Method for Image Sensing", inventors Selim Bencuya, Jiafu Luo and Richard Mann.

* cited by examiner

METHOD AND APPARATUS FOR VARYING A CMOS SENSOR CONTROL VOLTAGE

REFERENCE TO RELATED APPLICATION

This application is related to the commonly owned U.S. patent applications Ser. No. 11/029,100 (HBES 1013-1), entitled "Method and Apparatus for Removing Electrons from CMOS Sensor Photodetectors", by inventors Zeynep Toros, Richard Mann and Selim Bencuya; to Ser. No. 11/026,460 (HBES 1014-1), entitled "Method and Apparatus for Controlling Charge Transfer in CMOS Sensors with an Implant by the Transfer Gate", by inventors Toros et al.; to Ser. No. 11/026,582 (HBES 1015-1), entitled "Method and Apparatus for Controlling Charge Transfer in CMOS Sensors with a Transfer Gate Work Function", by inventors Toros et al.; to Ser. No. 11/026,278 (HBES 1016-1), entitled "Method and Apparatus for Controlling Charge Transfer in CMOS Sensors with a Graded Transfer Gate Work Function", by inventors Toros et al.; to Ser. No. 11/029,101 (HBES 1017-1), entitled "Method for Designing a CMOS Sensor", by inventors Toros et al.; and to Ser. No. 11/029,102 (HBES 1050-1), entitled "Method and Apparatus for Proximate CMOS Pixels", by inventors Toros et al.; all of said applications filed on the same day as this application and all incorporated by reference as if fully set forth herein.

BACKGROUND OF THE INVENTION

1. Field of the Invention

Embodiments are related to image sensors, computer readable descriptions of image sensors, and methods for making mage sensors, and more particularly to such embodiments of CMOS image sensors.

2. Descriptive of Relative Art

The active pixel sensor is used in CMOS based imager arrays for a variety of applications. The sensor consists of an array of pixels (rows×columns) with the associated active circuitry on the same chip. Each pixel contains a photosensitive device that senses the incoming light and generates a ΔV difference on a floating node. The readout is accomplished by selecting a row of pixels and reading out each column, either column by column or all columns at the same time. The XY addressable APS is designed for CMOS technology with minor modifications to the process for the pixel while maintaining low-power and lower cost features compared to the CCD technology. Another main advantage of using CMOS process is to have the pixel array with the associated active circuitry on the same chip and save area and cost. Despite all of the benefits of using the CMOS process, the picture quality of the CCD image sensors is still superior to the picture quality of the CMOS APS. One of the main reasons for this difference is that the CMOS process is not suitable to designing a good pixel element, unlike the CCD process which is designed specifically to build pixel elements that result in a high quality picture. Another limitation of the CMOS process is that the operating voltages are low and not flexible as in the CCD technology.

SUMMARY OF THE INVENTION

This innovation describes the process methods and process integration of an active pixel sensor that combines the advantages of both CCD and CMOS technologies. The low noise advantages of a true correlated multiple sampling pixel (e.g., Correlated Double Sample pixel) are created in a CMOS process with low cost and high performance with minimum impact on existing features and capabilities of the CMOS technology. Disclosed embodiments cover 4T pixel designs, although other protected embodiments cover 5T and other pixel designs.

Because of variations in the fabrication process, a CMOS image sensor designed to work with only a single set of parameters will result in a large percentage of defective products. A robust design anticipating and compensating for these process fluctuations includes a variable gate voltage applied to the transfer gate between each photodetector and its sense node. The transfer gate voltage can be set, for example, by setting a register.

One embodiment of the image sensor integrated circuit includes photodetectors such as photodiodes, nodes such as floating diffusions, and transfer devices such as transfer gates that control a transfer of the electrons between a photodetector and a corresponding floating diffusion. The circuit also includes reset devices such as reset transistors. Each floating diffusion node has a corresponding reset device which resets the node. The circuit also includes row and column circuitry such as row and column decoders, and signal devices such as source follower and row selector transistors. The circuit also includes variable voltage circuitry with a voltage selector determining a control voltage of the control signal applied to the transfer devices. Examples of a voltage selector are a register and a fuse.

Other embodiments include a method for fabricating the circuit and a computer readable description of the circuit, such as a layout or tapeout.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 6 shows a sketch of the transfer gate is turning on.

FIG. 7 shows a sketch of charge trapping where the transfer gate is on.

DETAILED DESCRIPTION

Figure 1:
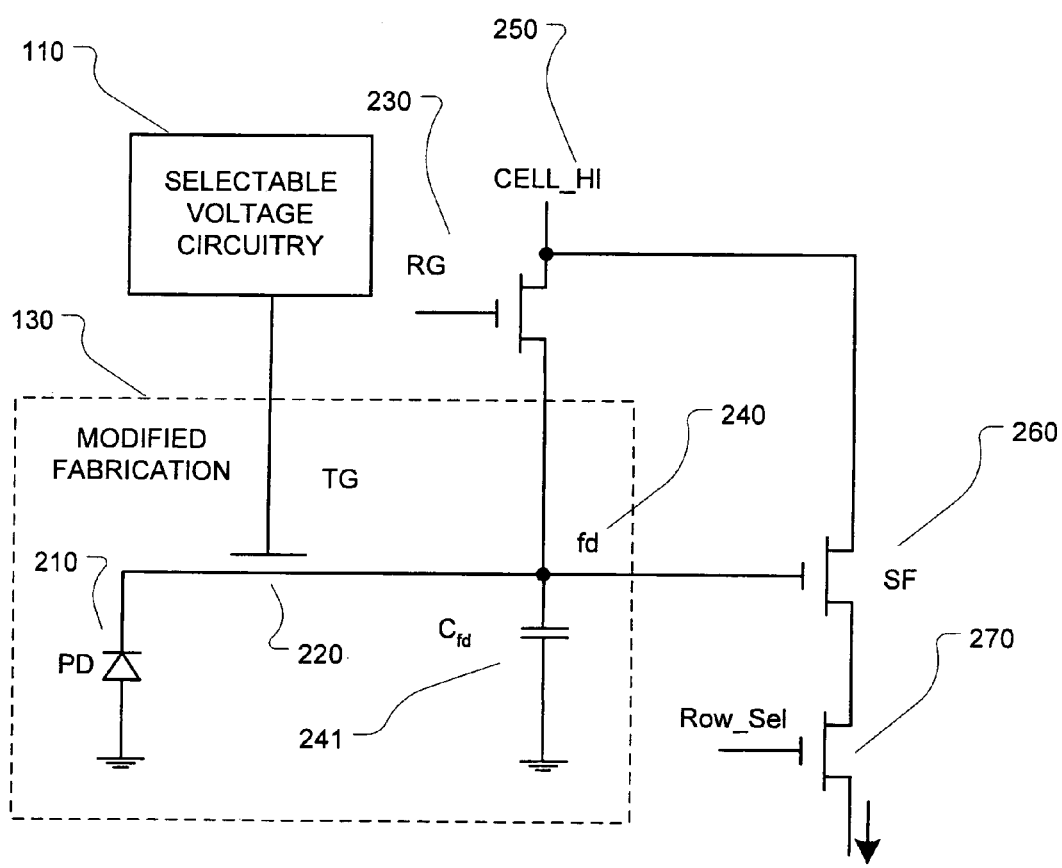
FIG. 1 shows a schematic of a pixel with improved performance.

The pixel as illustrated in FIG. 1 is designed to overcome limitations of the CMOS process and achieve good picture quality levels that are comparable to CCD sensors.

The pixel consists of a pinned photodiode (PD) 210 as light sensing element, a transfer gate (TG) 220, a floating diffusion 240 (and associated capacitance 241), a MOSFET as reset transistor 230, a second MOSFET as source follower 260, and a third MOSFET as row select transistor 270. The devices which have undergone modified fabrication 130 according to some embodiments include the pinned photodiode (PD) 210, the transfer gate (TG) 220, and the floating diffusion 240.

FIG. 1 also shows selectable voltage circuitry 110 coupled to the transfer gate 220. One current-carrying terminal of the reset transistor 230 is coupled to the floating diffusion 240 and another current-carrying terminal of the reset transistor 230 is coupled to a current-carrying terminal of the source follower 260.

The pixel is designed to be built with the CMOS process with additional implantation steps to improve the performance. Only modest positive biasing voltages are required which can easily be provided by a CMOS process without the need for special high voltage devices. The process modifications are in the pixel array and therefore the rest of the on-chip active circuitry need not be affected. Since the pixel uses the same operating voltages, the readout operation, timing, digital control block and the analog signal chain remain the same. The pixel is a 3 MOSFET+1 transfer gate pixel with a pinned photodiode as the light sensing element.

Charge remaining in the PD from the previous frame is called lag. Lag is usually caused by incomplete charge transfer. Incomplete charge transfer occurs mostly due to one or more of:

1) Charge is trapped in the PD because of too large of a barrier between the ON gate and the PD, and 2) In charge injection devices (such as CID imagers), the charge reset occurs by turning the gates off and injecting the charge to the substrate. But, when the gates turn on again, some of this charge may return to the potential well before recombining, resulting in image lag.

The latter cause "2)" is not the case for pixels which do not use the substrate for the charge reset. The PD and transfer region should be designed very carefully to avoid the former cause "1)".

Two effects of lag are that charge is lost from the original frame signal (distorting the current image), and charge is added to the next frame (distorting the next image). Therefore, image lag should be eliminated completely or at least as much as possible.

Figure 14:
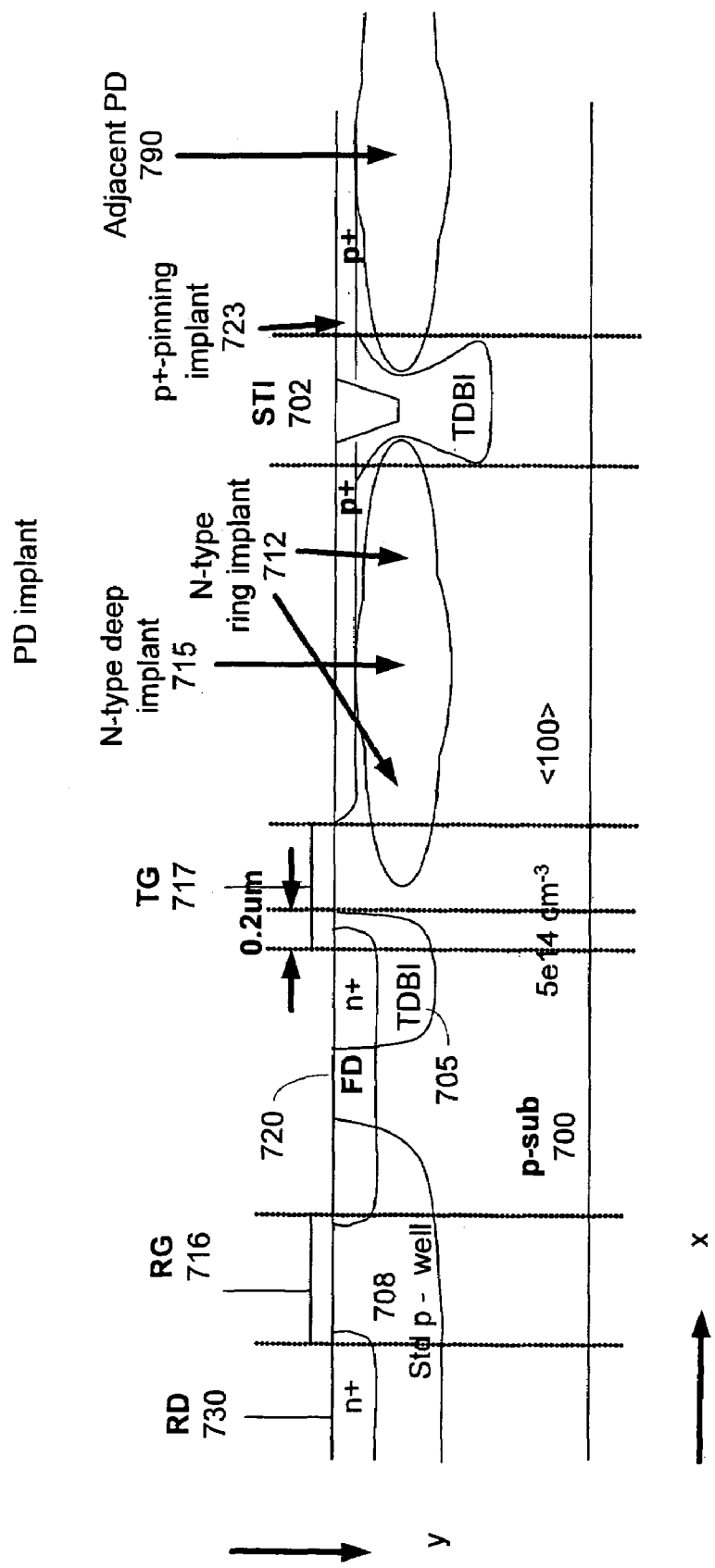
FIG. 14 is a cross-sectional schematic of a pixel with a separation between the transfer device barrier implant and the reset transistor p-well implant (in this example, with a separation of about 0.3 um-0.5 um), and an overlap of the transfer device barrier implant with the transfer gate (in this example, with an overlap of about 0.2 um).

To eliminate the image lag completely, the CMOS process flow is modified in the pixel area. FIG. 14 illustrates the cross-sectional view of the charge transfer in the pixel that is separated from the adjacent pixel by shallow trench isolation (STI) 702. The transfer gate 717 is a true gate structure that is placed between the pinned photodiode 712, 715 and the n-type floating diffusion 720. The purpose of the transfer gate 717 is:

a) to keep the integrated charge in the PD 712, 715 separated from the floating diffusion 720 during charge integration period, b) to perform complete charge transfer during charge readout by turning transfer gate 717 on, and c) global reset; electronically resetting the pixels by turning both the transfer gate 717 and reset gate 716 on.

Additional implants help to perform a complete charge transfer:

1) An additional p-type implant 705, such as a lighter boron doping implant (also called "transfer device barrier Boron implant").

2) A deep n-type photodiode implant 715 (e.g., low dose)

3) A shallow n-type photodiode implant 712 (e.g., ring shaped and high dose).

A fourth implant can also be used to improve performance by adjusting the work function of the transfer device gate 717 to be "graded" from n-type where it overlaps the sense node 720 drain to more p-type where it overlaps the n-type photodiode 712, 715.

The high performance and low cost of this pixel innovation is also realized through the optimum use and placement of process layers and implants in the baseline CMOS process. Specifically, the p-well for formation of NMOS devices in a CMOS process is employed to provide isolation between pixels. In addition, the p-well provides isolation from the traps and surface states associated with the STI which is used in submicron CMOS. This isolation is used for the integrated photodiode to achieve low dark currents more typical of a CCD device. The PLDD implant is employed to provide junction isolation for dark current reduction from the surface states in the diode.

The transfer device Boron implant (TDBI) helps the TG turn on more easily, and therefore improves the charge transfer. The deep n-implant and n-type ring implant in the PD are both used to adjust the PD capacitance as well as charge transfer operation by introducing a potential gradient that helps the charge move towards the floating diffusion when the TG is turned ON.

By optimizing the pixel as described above, the amount of the charge than can be transferred completely is maximized. Since the floating diffusion potential can be read out before and after charge transfer, the noise level can be reduced by correlated double sampling. Therefore, the dynamic range improves significantly, and image-lag is eliminated. The pixel described in this innovation is comparable to CCD pixels and will result in good picture quality comparable to CCD sensors.

Advantages:

1) Reduced dark current noise: Dark current is one of the important contributors to the output noise. The significant component of the dark current is generated at silicon/silicon dioxide interface. Pinned photodiode will reduce the dark current generation significantly by keeping the surface accumulated with holes. A transfer gate with an appropriate work function, such as p-type polysilicon, reduces dark current under the transfer gate and attracts holes to the region by the transfer gate.

2) Reduced kTC noise: The design of the pixel with the transfer gate enables true correlated double sampling at the output. Therefore the noise that is generated at the output amplifier can be eliminated. The output amplifier becomes very much like a CCD sensor output.

3) Higher signal level: The additional n-type photodiode implants are intended to maximize the capacitance of the PD, and still perform complete charge transfer during readout. The pixel ring implant even increases capacitance in the region between the deep implant and the nearby STI region which has been implanted with p-type dopants.

4) Increased dynamic range: Optimizing the PD capacitance and reducing the output amplifier noise maximizes the dynamic range.

Figure 2:
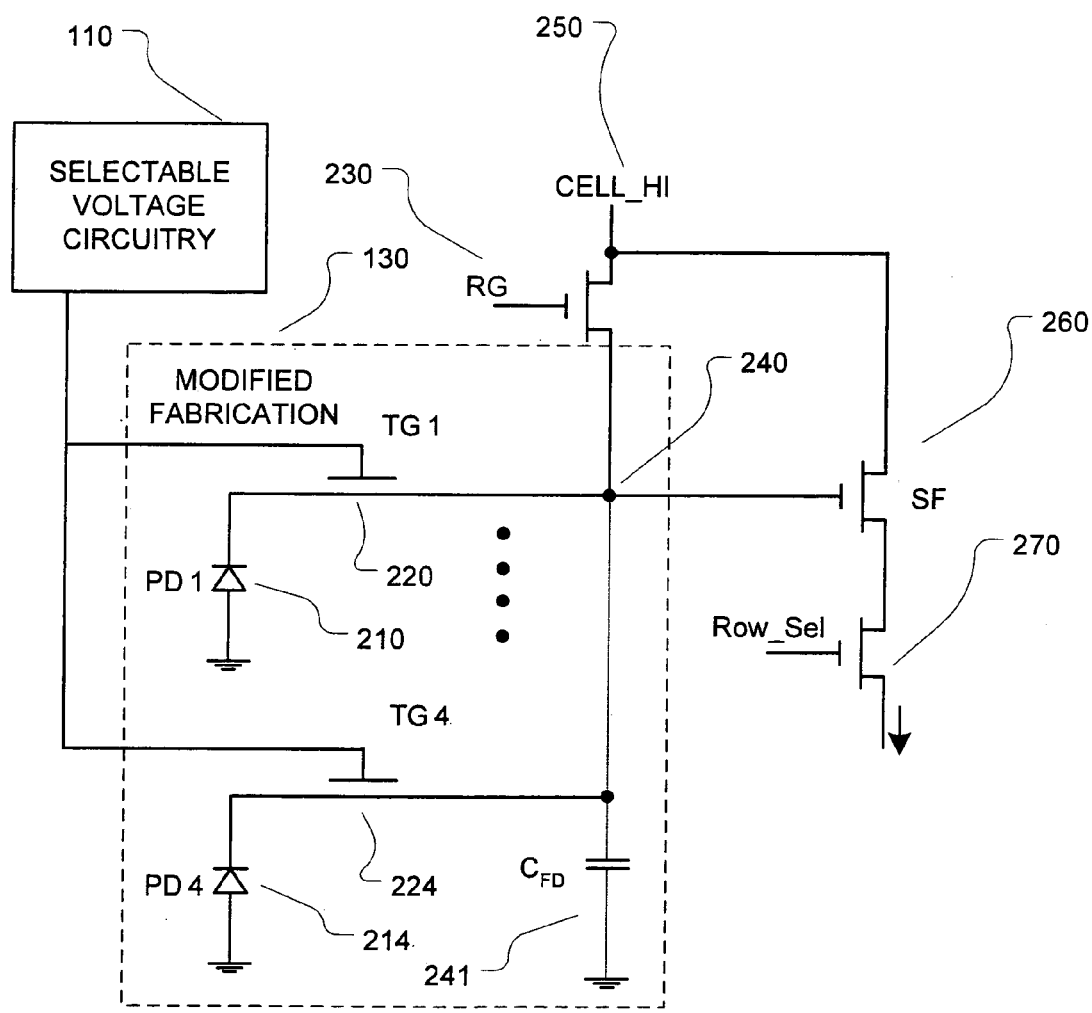
FIG. 2 shows a schematic of pixels with improved performance that share circuitry.

5) The same pixel can be used in shared architecture. (FIG. 2.) Sharing the SF 260, RG 230 and Row_Sel 270 transistors increases the fill factor of the pixel. Higher dynamic range and signal-to-noise ratio are achieved.

6) A CMOS pixel sensor is designed to achieve good picture quality associated with CCD image sensors while maintaining a) low-power b) low-cost and c) On chip active circuitry integration features of the CMOS technology.

However, these advantages are accompanied by the addition of extra implant steps to the CMOS process to build the charge transfer device to achieve complete charge transfer.

Figure 3:
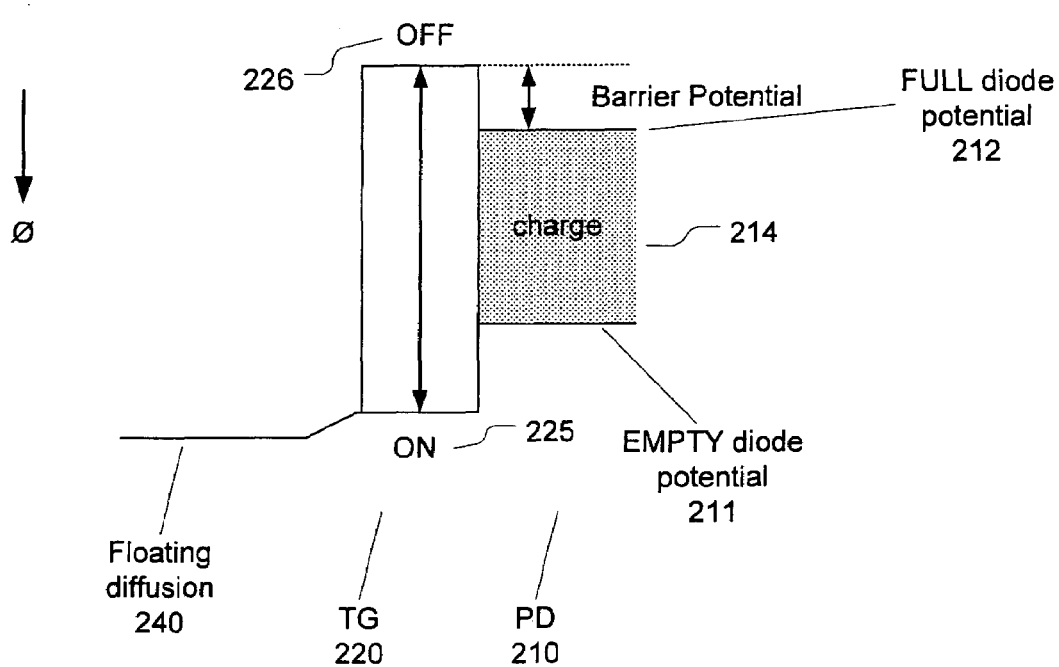
FIG. 3 shows a sketch of the potential profile in the charge collection and transfer region.

FIGS. 3-8 show the behavior of the transfer gate. The phi symbol indicates potential increasing in the downward direction of the arrow. Ideally, when the TG 220 is OFF, charge should be collected in the pinned PD 210. The difference between the full diode potential 212 and empty diode potential 211 determines the charge collection capacity of the pixel. FIG. 3 also shows the collected charge 214, the barrier height 213 between the collected charge 214 and the transfer gate off potential 226. This value can be optimized by varying the n-type PD implant, and the TDBI implant.

Figure 4:
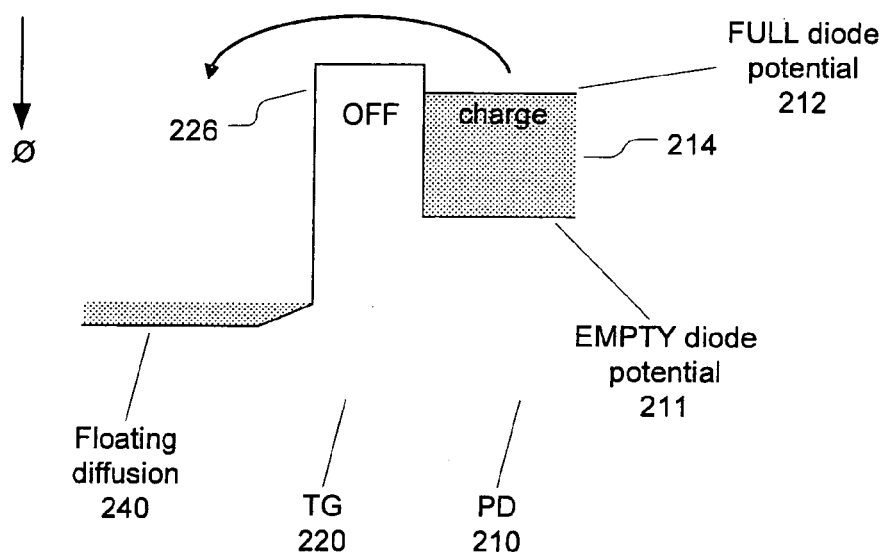
FIG. 4 shows a sketch of charge leakage resulting from a weak barrier when the transfer gate is off.

If the TDBI concentration is too low, then the OFF TG 226 cannot provide enough of a barrier for electrons 214 collected in the PD 210 resulting in a constant leakage into the floating diffusion region 240. The potential profile of the charge leakage is shown in FIG. 4. Constant leakage is not desirable and should be avoided. The TG 220 becomes useless and cannot isolate the charge 214 from the FD region 240 during charge integration. The pixel becomes like a 3 transistor pixel. Therefore, the TDBI dose and energy should be selected very carefully to avoid constant charge leakage from the PD 210 to the FD 240 to make sure that the pixel does have enough charge capacity. The dynamic range and signal to noise ratio depend on this signal.

Figure 5:
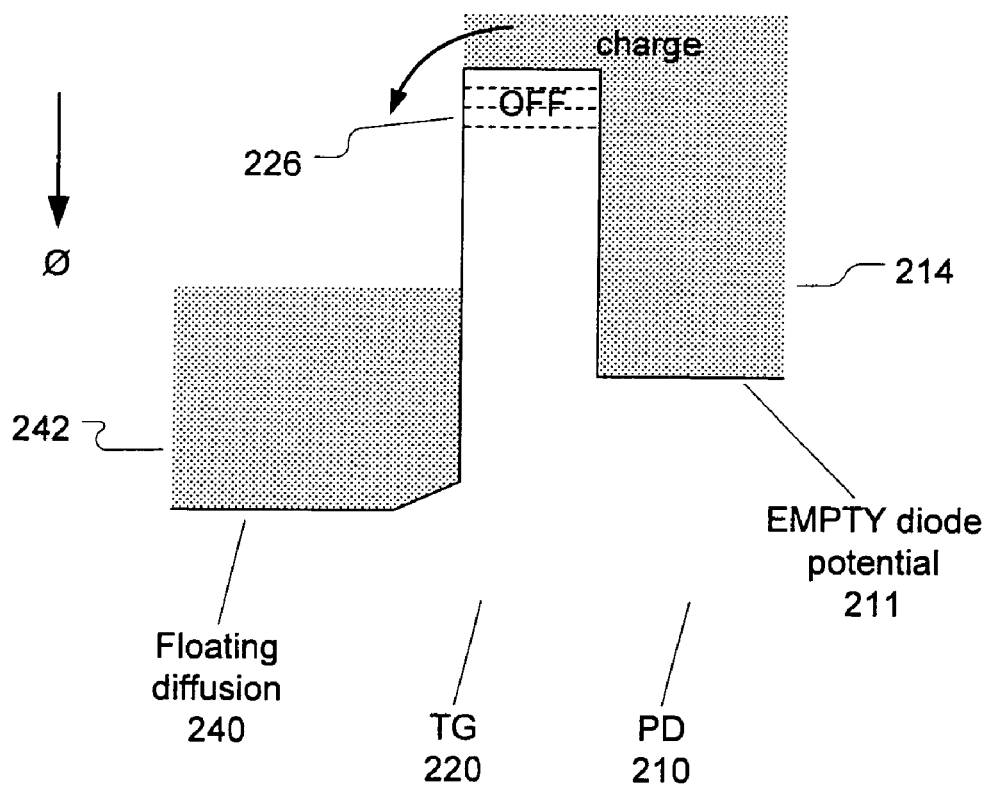
FIG. 5 shows a sketch of blooming control, where the off voltage of the transfer gate is adjustable to the desired level.

In case of a very bright light, the PD can get saturated and excess charge is going to flow over the OFF TG (FIG. 5). This is not the same as charge leakage. The TG 220 acts like a blooming control device. The OFF gate voltage can be set to an intermediate value (shown as multiple values 226) during charge integration for blooming control. Excess charge 242 is drained to the FD, and removed by turning the RG on. Setting the TG OFF voltage to an intermediate value (somewhere between OFF and ON states) essentially controls the signal capacity of the pixel. The highest capacity is obtained with the most negative TG voltage. Intermediate levels reduce the signal, and therefore can be used as blooming control.

The TDBI concentration should be optimized such that while the TG is OFF, the barrier under the TG should provide enough barrier for the charge integrated in the PD. On the other hand, when the TG turns ON, this barrier should disappear completely so that the charge can be transferred.

Figure 6:
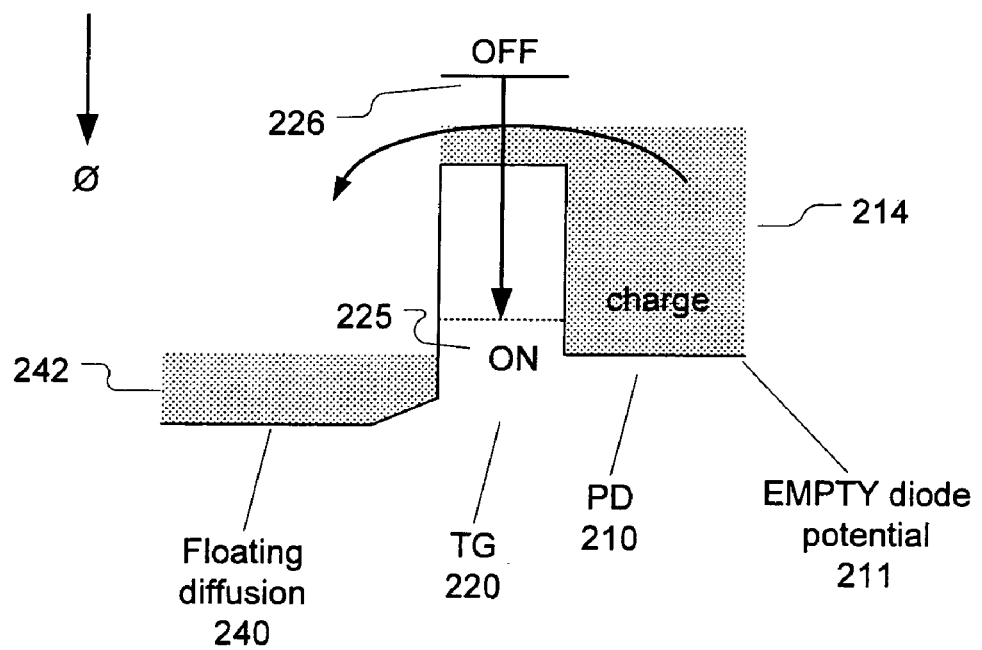
Figure 7:
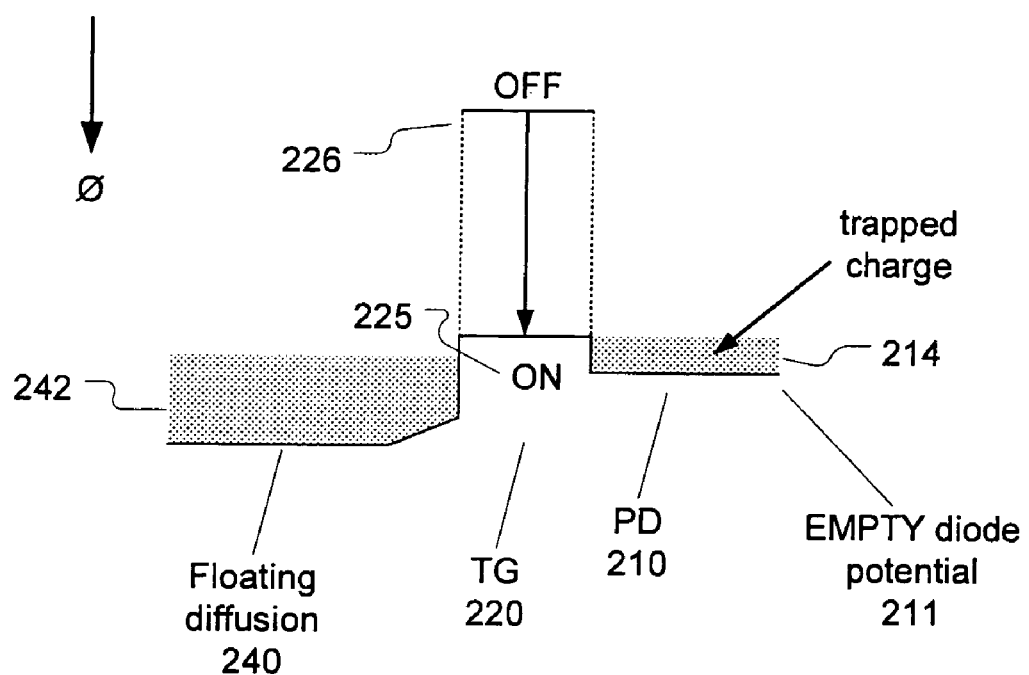

FIGS. 6 and 7 show the 2D potential profile of the charge transfer area with the TG turning ON 225. Because of the overly strong TDBI concentration, there is some charge trapped 214 in the PD 210, as shown in FIG. 7. This charge causes image lag and is not desired. The pixel should be designed so that no charge gets trapped in the PD after charge transfer is finished. The need to manage the charge transfer barrier at the proper level is the most difficult aspect of the robust design of the charge transfer device. It is classically difficult to insure a high barrier with no leakage in the off 226 or NO TRANSFER state while assuring the complete transfer of a large amount of charge in the on 225 or transfer state.

Figure 8:
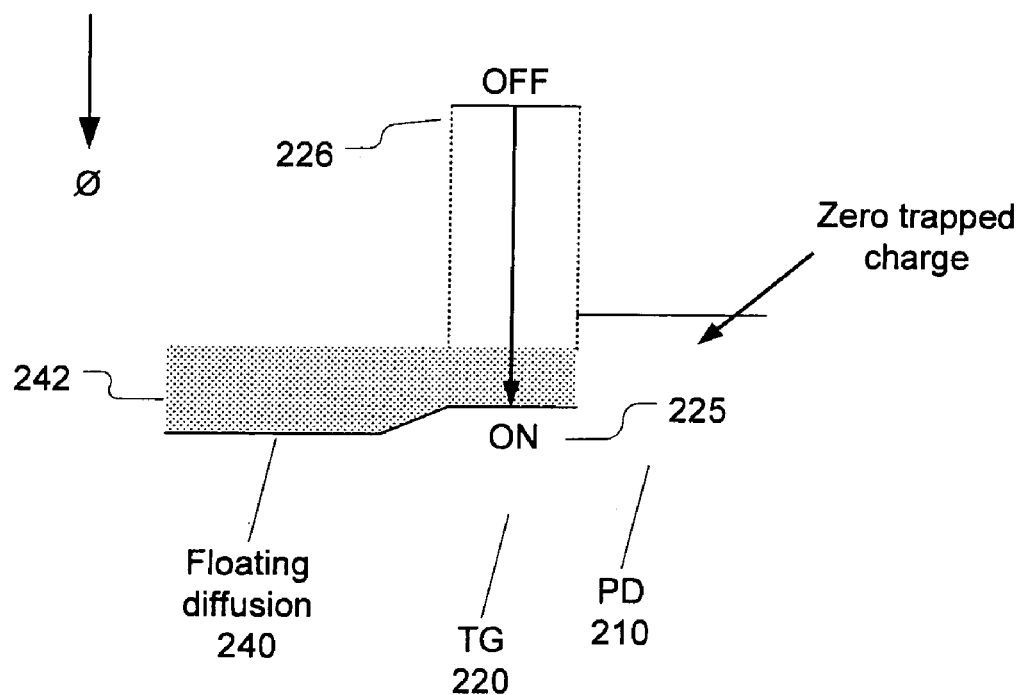
FIG. 8 shows a sketch showing that by raising the transfer gate voltage, the barrier is removed, allowing the charge to flow.

In our innovation, the manufacturing and performance window of operation of the pixel is increased by using elevated voltages on the transfer gate. Thus even if there is some residual charge in the PD, by raising the TG voltage even further, this charge can be transferred from the PD to the FD (FIG. 8). Since the channel potential rises under the transfer gate, the maximum absolute voltage of the transfer gate can be safely increased without creating a high electric field across the gate oxide dielectric materials. The use of higher voltages on the transfer gate is anticipated in the device design, resulting in a strong barrier to charge transfer in the off state which is forced down by a larger voltage on the transfer gate during transfer. In this manner the effective threshold of the transfer device is sufficient to block unwanted charge transfer in the off state. The threshold of the device will vary in manufacture and thus the minimum gate voltage to assure adequate charge transfer will have process variation. Use of a transfer gate voltage which is above the maximum required will insure that the transfer is always complete.

The charge pump should be designed to provide at least one VT above the supply voltage. Higher TG voltage is safe to use since this gate operates with strong backbias. In our innovation an adjustable voltage pulse is provided to the transfer gate in which the maximum applied voltage and the rise and fall times of the transfer gate voltage pulse can be adjusted. On chip adjustment through a DAC is provided to allow testing of the charge transfer properties at a range of voltages. In this manner the needed manufacturing margin for complete charge transfer in product operation can be verified.

After carefully optimizing the TG structure to obtain complete charge transfer, and the PD to achieve desired signal level, the switching time of the TG should also be considered. When the TG switches from ON to OFF, charge can spill back into the PD especially if this gate is turned OFF too quickly. Therefore, enough time should be allowed for this gate to turn off. This time can be in the range of 50 ns to 150 ns.

While the deep n-type diode implant mainly determines the collection depth of the electrons, and the PD capacity, the shallower n-type ring implant in the PD is used to increase the capacity around the edges of the PD. The main purpose of the shallow implant other than contributing to the PD capacity, is to provide a potential gradient toward the TG for the electrons when this gate is turned ON. The three sides of the ring structure neighboring the STI utilize the edges and improve the signal capacity. The side that is adjacent to the poly-gate shifts the potential maximum towards the FD when the TG is turned on and introduces a potential gradient from the center of the PD towards the TG edge of the PD, and acting like a channel for the electrons to flow from the PD over to the FD region. Otherwise, it is much more difficult to transfer the integrated charge completely to the PD, and avoid image lag. The potential gradient also helps the transfer time. Because of this gradient, the electrons move faster to the floating diffusion node, and the time for the charge transfer is reduced significantly. Sample ring implant dose and energy are 8e11, 150 keV.

The TDBI does not extend under the TG completely. Rather, the TDBI extends, for example, by about 0.2 um. These three implants—TDBI, deep n-type diode implant, and the shallow ring-implant—and the TG length are optimized and laid out so that whole range of the supply voltage can be used to store and transfer the charge. The threshold voltage of this gate is reduced so that the charge transfer occurs under this gate very close to the surface. When the gate is turned on, the charge flows from the deep n-diode region to the surface where the shallow n-region is. The TDBI barrier disappears completely under the TG and the charge flows from the shallow n-region into the FD.

Even though charge transfer occurs under the TG at the p-well edge very close to the surface, charge integration takes place in the PD with this gate turned OFF. The collection depth is determined by the deep n-type implant. As more charge gets collected in the PD, the potential maximum in the silicon moves closer to silicon/dioxide interface. The deeper the n-implant goes, the more the PD capacity. Deeper implants also provide a more favorable electric field implant for the collection of red light. The tail of the potential profile is also important. If the junction is too abrupt, the collection of the electrons due to red light becomes more difficult. Therefore, the junction depth is adjusted, for example, to about 1.5 um for this structure. While the shallow n-type ring implant better utilizes edges of the PD, and provides a potential gradient for the charge to transfer close to the silicon surface, the deep n-type implant is used to have enough PD capacity and charge collection depth. The implant dose and energy in one embodiment are about 1e12 and 300 keV for this design.

Red light collection and overall pixel capacity are also optimized by building the device on an epitaxial substrate. An P epi layer of, for example, about 5E14 concentration with a thickness of 4 to 5 microns is optimal in one case. The electric field from the P+ substrates concentration of boron helps to reflect photoelectrons towards the surface for collection by the photodiode.

For this structure, the parameters are boron with dose and energy in the range of 1.75e12, 50 keV and 1.2e13, 200 keV. The best doping levels can be optimized based upon consideration of additional process details such as starting material doping level and the exact thermal cycles of the process.

Figure 9:
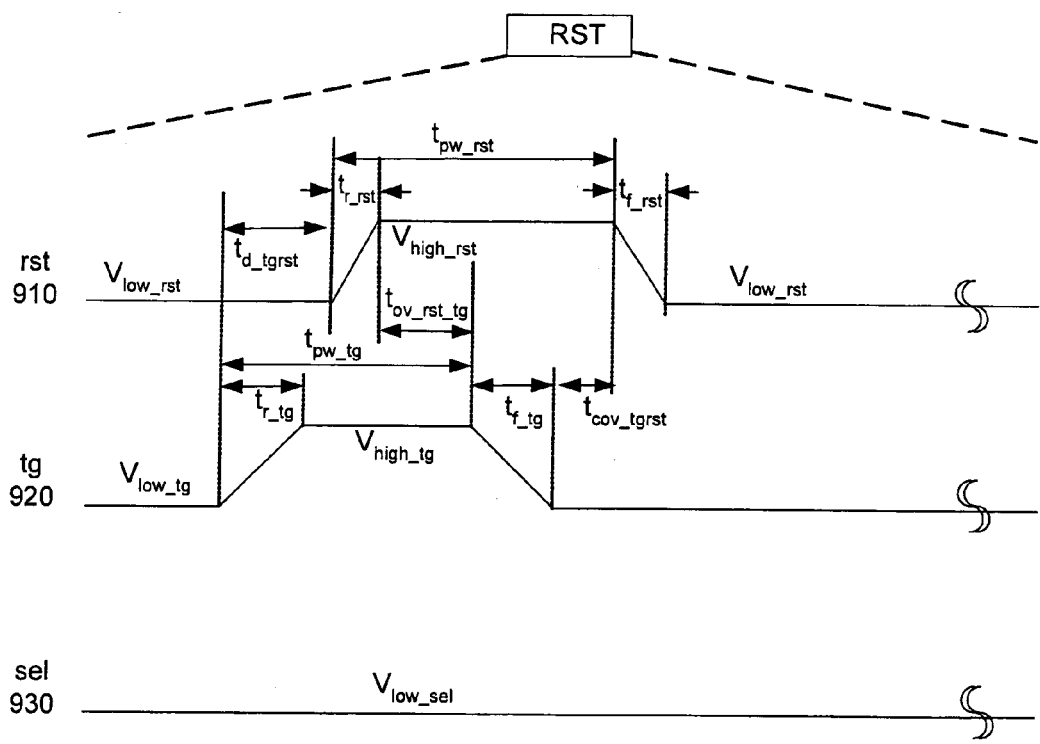
FIG. 9 shows a timing diagram of the RST operation to reset the floating diffusion voltage with a positive delay time.
Figure 10:
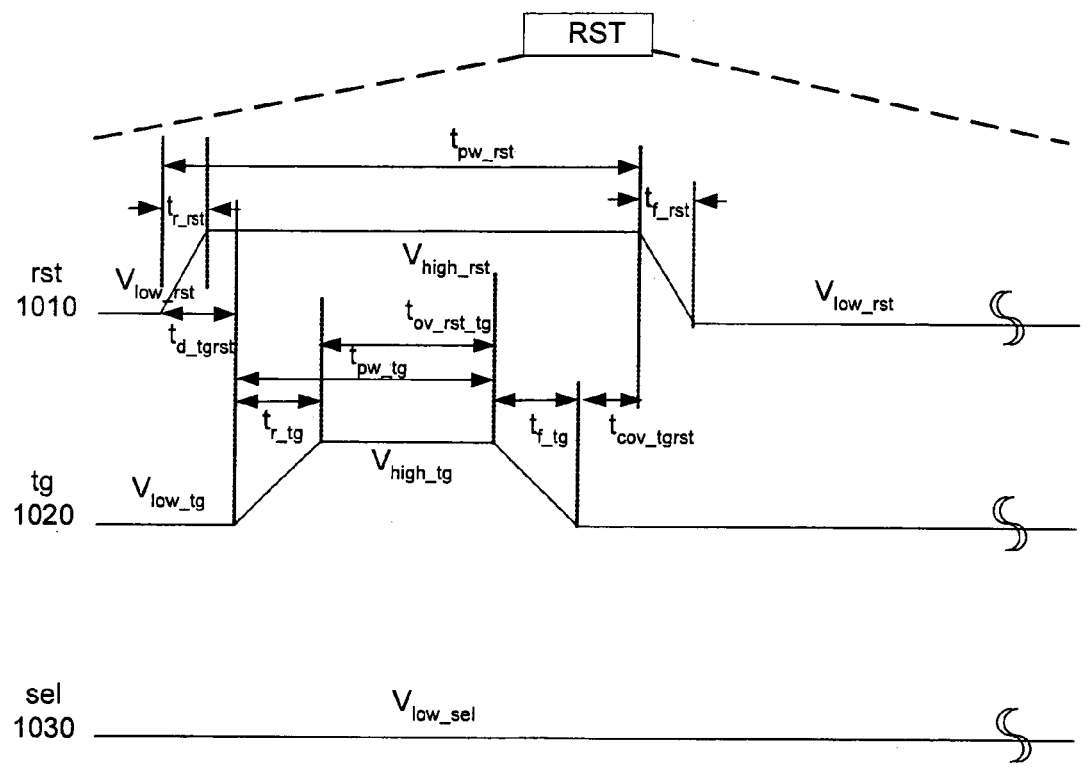
FIG. 10 shows a timing diagram of the RST operation to reset the floating diffusion voltage with a negative delay time.

Timing:

The pixel operation consists of the basic three functions:
1) Resetting the floating diffusion voltage (RST) FIGS. 9 and 10.

FIGS. 9 and 10 show a timing diagram of the RST operation to reset the floating diffusion voltage. FIG. 9 shows the reset with a positive delay time and FIG. 10 shows the reset with a negative delay time. The sel voltage remains at $V_{low\_sel}$. The tg voltage rises $V_{low\_tg}$ to $V_{high\_tg}$ over a time of $t_{r\_tg}$, and then falls back to $V_{low\_tg}$ over a time of $t_{f\_tg}$. The rst voltage rises from $V_{low\_rst}$ to $V_{high\_rst}$ over a time of $t_{r\_rst}$, and then falls back to $V_{low\_rst}$ over a time of $t_{f\_rst}$.

The time $t_{pw\_rst}$ begins when the rst voltage begins to rise from $V_{low\_rst}$ to $V_{high\_rst}$, and ends when the rst voltage begins to fall from $V_{high\_rst}$ to $V_{low\_rst}$. The time $t_{pw\_tg}$ begins when the tg voltage begins to rise from $V_{low\_tg}$ to $V_{high\_tg}$, and ends when the tg voltage begins to fall from $V_{high\_tg}$ to $V_{low\_tg}$. The time $t_{cov\_tgrst}$ begins when the tg voltage has fallen from $V_{high\_tg}$ to $V_{low\_tg}$, and ends when the rst voltage begins to fall from $V_{high\_rst}$ to $V_{low\_rst}$.

In FIG. 9, there is a positive delay time of $t_{d\_tgrst}$ from the time when the tg voltage begins to rise from $V_{low\_tg}$ to $V_{high\_tg}$, to the time when the rst voltage begins to rise from $V_{low\_rst}$ to $V_{high\_rst}$. In FIG. 10, there is a negative delay time with a magnitude of $t_{d\_tgrst}$ from the time when the rst voltage begins to rise from $V_{low\_rst}$ to $V_{high\_rst}$ to the time when the tg voltage begins to rise from $V_{low\_tg}$ to $V_{high\_tg}$.

The time overlap of the rst voltage being at the voltage $V_{high\_rst}$ and the tg voltage being at the voltage $V_{high\_tg}$ is the time $t_{ov\_rst\_tg}$. In FIG. 9, the rst voltage rises from $V_{low\_rst}$ to $V_{high\_rst}$ after the tg voltage rises from $V_{low\_tg}$ to $V_{high\_tg}$, and the tg voltage falls from $V_{high\_tg}$ to $V_{low\_tg}$ before the rst voltage falls from $V_{high\_rst}$ to $V_{low\_rst}$. Thus in FIG. 9, the time $t_{ov\_rst\_tg}$ begins after the rst voltage has risen from $V_{low\_rst}$ to $V_{high\_rst}$ and ends when the tg voltage begins to fall from $V_{high\_tg}$ to $V_{low\_tg}$. In FIG. 10, the tg voltage rises from $V_{low\_tg}$ to $V_{high\_tg}$ after the rst voltage rises from $V_{low\_rst}$ to $V_{high\_rst}$, and the tg voltage falls from $V_{high\_tg}$ to $V_{low\_tg}$ before the voltage of rst falls from $V_{high\_rst}$ to $V_{low\_rst}$. Thus in FIG. 10, the time $t_{ov\_rst\_tg}$ begins after the tg voltage has risen from $V_{low\_tg}$ to $V_{high\_tg}$ and ends when the tg voltage begins to fall from $V_{high\_tg}$ to $V_{low\_tg}$.

2) Charge integration in the photodiode (INT)

Figure 11:
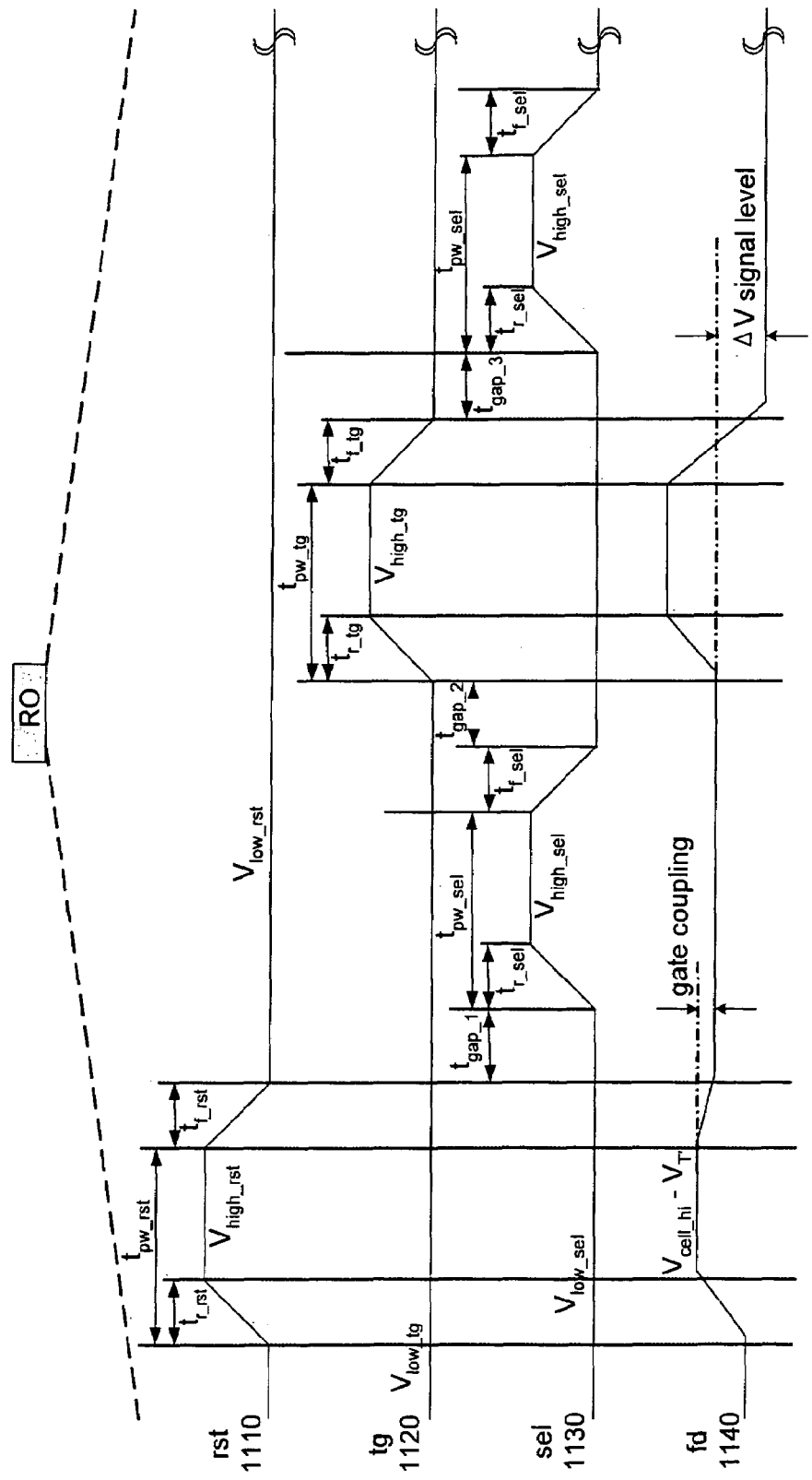
FIG. 11 shows a timing diagram of the RO (readout) operation to read out the charge, where the SEL (select) signal is turned low after the RST (reset) level is sampled, and the SEL signal is turned high again to sample the signal level.
Figure 12:
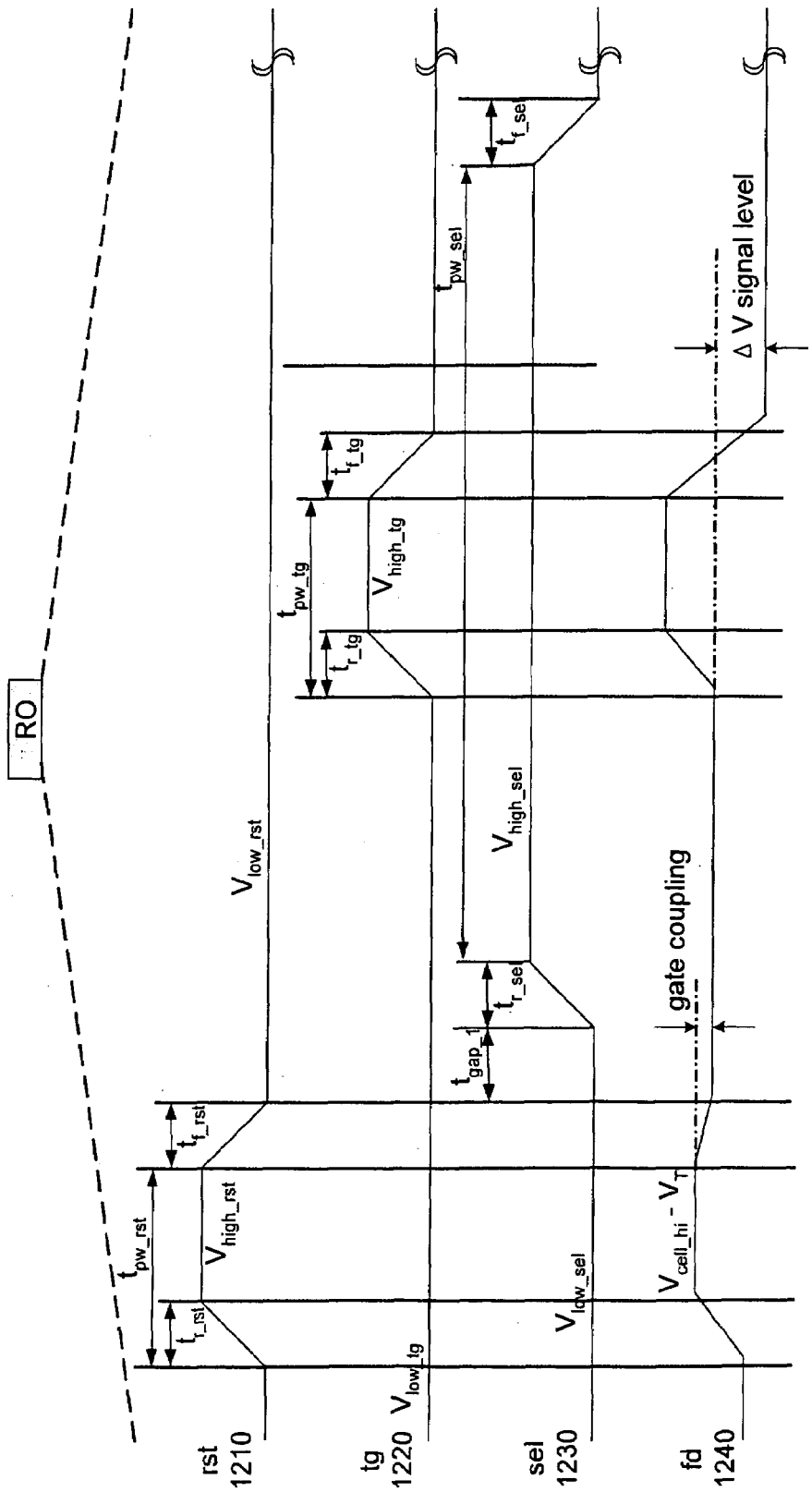
FIG. 12 shows a timing diagram of the RO operation to read out the charge, where the SEL signal is kept high until the transfer gate voltage is turned low.

3) Charge readout (RO) FIGS. 11 and 12.

FIGS. 11 and 12 show a timing diagram of the RO (readout) operation to read out the charge. In FIG. 11, the SEL (select) signal is turned low after the RST (reset) level is sampled, and the SEL signal is turned high again to sample the signal level. In FIG. 12, the SEL signal is kept high until after the transfer gate voltage is turned low.

The rst voltage rises from $V_{low\_rst}$ to $V_{high\_rst}$ over a time of $t_{r\_rst}$. In response, the fd voltage rises to $V_{cell\_hi}$-$V_{T'}$ (for example, CELL_HI 250 on FIG. 1 minus a threshold voltage). The rst voltage then falls back to $V_{low\_rst}$ over a time of $t_{pw\_rst}$. In response, the fd voltage falls slightly due to gate coupling. The time $t_{pw\_rst}$ begins when the rst voltage begins to rise from $V_{low\_rst}$ to $V_{high\_rst}$, and ends when the rst voltage begins to fall from $V_{high\_rst}$ to $V_{low\_rst}$.

After a time delay of $t_{gap\_1}$ after the rst voltage has fallen back to $V_{low\_rst}$, the sel voltage begins to rise from $V_{low\_sel}$. The sel voltage rises from $V_{low\_sel}$ to $V_{high\_sel}$ over a time of $t_{r\_sel}$. In FIG. 12, the sel voltage remains at $V_{high\_sel}$ while the tg voltage rises from $V_{low\_tg}$ to $V_{high\_tg}$ and falls back to $V_{low\_tg}$. In FIG. 12, the time $t_{pw\_sel}$ is the duration during which the tg voltage remains at $V_{high\_sel}$. The sel voltage falls from $V_{high\_sel}$ to $V_{low\_sel}$ over a time of $t_{f\_sel}$.

The tg voltage rises from $V_{low\_tg}$ to $V_{high\_tg}$ over a time of $t_{r\_tg}$. In response, the fd voltage also rises. The tg voltage falls back to $V_{low\_tg}$ over a time of $t_{f\_tg}$. In response, the fd voltage also falls. The signal level is the difference between this final fd voltage and the fd voltage after the fd voltage falls due to gate coupling with the falling rst voltage.

In FIG. 11, the sel voltage does not remain at $V_{high\_sel}$ while the tg voltage turns high and back low. Instead, after the sel voltage has risen to $V_{low\_sel}$ for the first time, the sel voltage falls to $V_{low\_sel}$ and after the sel voltage has been at $V_{low\_sel}$ for a time delay of $t_{gap\_2}$, the tg voltage begins to rise from $V_{low\_tg}$ to $V_{high\_tg}$. After the tg voltage falls from $V_{high\_tg}$ to $V_{low\_tg}$ and the tg voltage has been at $V_{low\_tg}$ for a time delay of $t_{gap\_3}$, the sel voltage begins to rise for a second time from $V_{low\_sel}$ to $V_{high\_sel}$. For both sel voltage pulses in FIG. 11, the sel voltage rises from $V_{low\_sel}$ to $V_{high\_sel}$ over a time of $t_{r\_sel}$, and the sel voltage falls from $V_{high\_sel}$ to $V_{low\_sel}$ over a time of $t_{f\_sel}$. For both sel voltage pulses in FIG. 11, the time $t_{pw\_sel}$ begins when the sel voltage begins to rise from $V_{low\_sel}$ to $V_{high\_sel}$, and ends when the sel voltage begins to fall from $V_{high\_sel}$ to $V_{low\_sel}$.

Both RG and TG are turned ON to reset the PD node, and reset the PD. This ensures to remove all the residual charge from the PD (if any). FIGS. 9 and 10. Reset is followed by charge integration. Both gates are kept at low voltages while charge is integrated in the PD. At the end of the charge integration, charge readout period starts. This is illustrated in FIGS. 11 and 12. First, the RG is turned on and the reset level is sampled by turning the Row_sel transistor ON. Then the TG is turned on to transfer the charge to the FD. The Row_sel can be either kept at ON state, or turned ON again to sample the signal level. This operation is repeated every frame time.

Design Methodology:

The pixel layout and implants in this innovation are optimized by a simulation methodology that insures a near optimal solution. An description of this device design flow is provided below:

Step 1: Choose a diode pinning implant. We suggest an implant similar or identical to PLDD as the PD pinning implant.

Pldd implant can be used to pin the surface of the PD with holes to the most negative potential. This insures low dark current and a surface electric field favorable to collection of blue light. Pldd is not the only solution as pinning implant. It is preferred since it comes free with the CMOS process and works well as the pinning implant of the PD. In this innovation the choice of the exact dose and energy for the pinning implant are less critical because the pinning implant position greatly reduces the effect of the electrical barrier to charge transfer. The pinning implant is self aligned to the transfer gate edge like a PLDD which reduces variation due to errors in dimensions and alignment of the mask.

Step 2: Select a TG length depending on the pixel size, layout and architecture.

And select starting dose and energy implants for the Ntype Deep and N-type shallow ring implants for the photodiode.

Obtain the following by Steady-state analysis:

3) Determine the empty PD potential by adjusting the n-type deep and n-type shallow ring implants to obtain a desired amount of signal capacity with the TG off. If it is too high, charge transfer will suffer. If it is too low, the signal level will be too low.

And then obtain the following by transient analysis:

4) Adjust the TDBI concentration to isolate the charge from the floating diffusion while the TG is OFF. If there is too much leakage, increase the TDBI doping.

5) Find the maximum signal level by overfilling the PD and reaching a steady state over time with the TG turned OFF.

6) Transfer the charge from the PD to floating diffusion by switching the TG ON and OFF. If charge is trapped, raise the TG ON voltage. Adjust the ring implant dose, energy and location to achieve a potential gradient towards the FD during charge transfer. The maximum transfer gate voltage applied in the analysis is based upon the ability to generate and manage an elevated potential in the CMOS process. An example is the use of a 5.5 volt maximum transfer gate voltage for a 3.3 volt CMOS process. (a 3.3 volt CMOS process is a process for which a 3.3 volt potential can be applied across the gate dielectric while maintaining acceptable long term reliability). The goal of the device design is to insure that complete charge transfer occurs below the target maximum voltage to insure margin for manufacture.

7) If the charge cannot be transferred completely or if there is not enough diode capacity after the step, go back to the beginning and repeat the steps, typically starting from 1) to optimize the pixel.

Optimization of the pixel is an iterative process. The convergence to the desired solution is faster if the starting point is not very far off. Therefore, the first guess is important. A good guess based on previous experience makes a good starting point.

After a desired signal capacity is achieved and the pixel operation is verified by simulations, continue with the following analysis:

Color cross-talk:

8) If there is no residual charge in the PD after charge transfer, and the desired signal level is achieved, the color cross-talk should be determined. For this purpose, light at different wavelengths (blue, green, and red) should be shined onto the pixel while extracting the amount of charge collected in the adjacent PD. The p-well provides very good isolation between pixels. The TDBI function as an isolation barrier between pixels should be verified.

9) If the cross-talk is higher than tolerable amount, go back to earlier steps, typically from step 1),
   a. adjust the depth of charge collection by changing the n-type PD implant energy and/or
   b. use p-well as oppose to the TDBI for STI, and/or
   c. make the PD to PD distance larger in the layout.

Sensitivity to the misalignment of mask layers:

10) Move mask layers around to verify the critical dimensions. The pixel operation may be very sensitive to some of the drawn locations of the mask layer. Determine the most crucial layers, and the degree of the failure if the mask is misaligned. Find more robust solutions. A clear advantage of this innovation of the relative insensitivity of the device operation to normal variation in the size and placement of the implant masks.

Embodiments of the TDBI implant cover the left edge of the transfer gate device to provide an adequate barrier and isolation between the floating node (or sense node) and the photodiode. The TDBI concentration is targeted so that the TDBI boron under the gate can be inverted to form an N type channel. This inversion is made facile by the ability to pump the transfer gate to an elevated voltage to continue the charge transfer process as the channel and photodiode potential become more positive. The TDBI implant and the deep phosphorous diode implant overlap. This insures that the right portion of the transfer gate device is electrically coupled to the photodiode.

Figure 13:
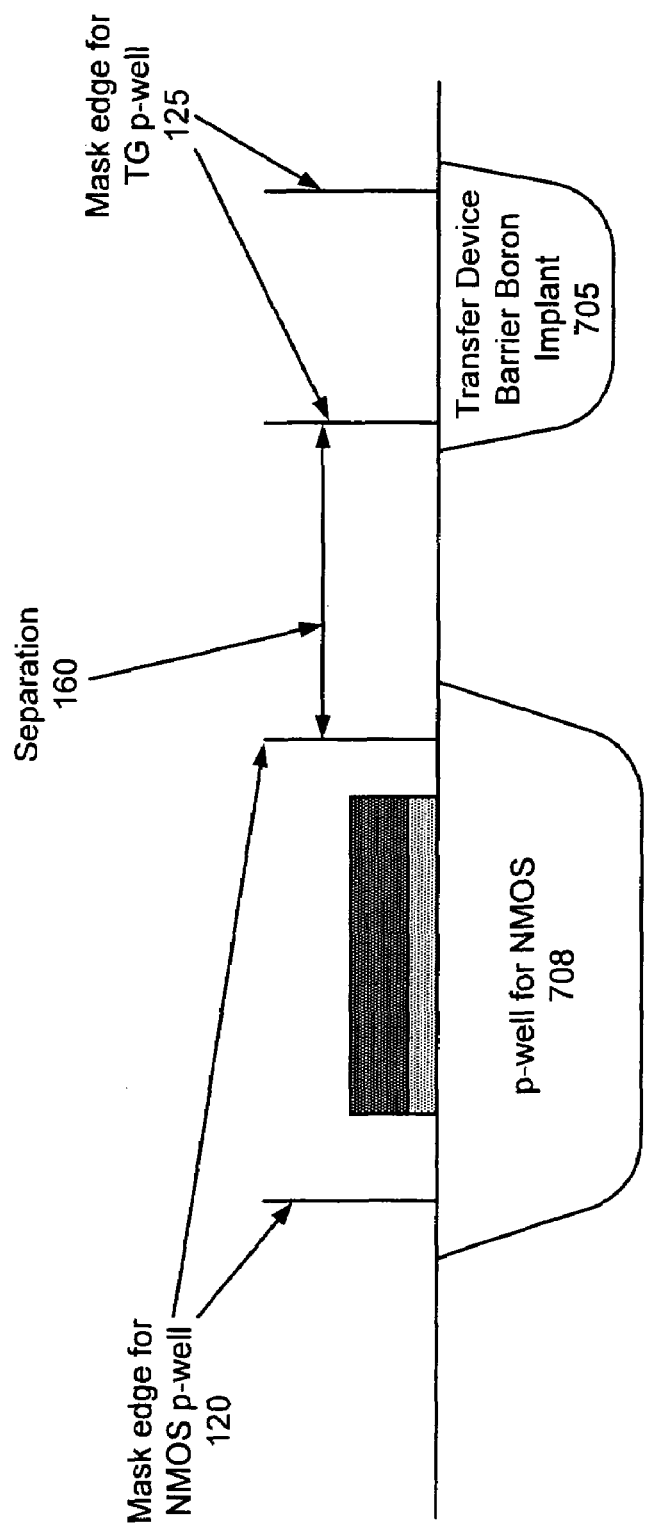
FIG. 13 is a cross-sectional schematic of a pixel with a separation between a typical p-well and the transfer device barrier boron p-well.

Features for Device Performance in Integration into CMOS:

1) Use of n-type MOS device in the pixel:
   reduces cost and assures predictable performance
   p-well implant for CMOS n-type FET provides effective energy barrier for electron cross-talk between pixels.
   TDBI also provides a good barrier between the adjacent pixels.
   Depending on the layout, both standard and lighter TDBI can be used for isolation.
   TDBI can also be used for reset transistor. The threshold voltage of this transistor is reduced and the RG cam be laid out in the same TDBI as the TG.
   FIG. 13 sows that if the reset transistor is designed with the p-well, the layout is optimized to integrate with the transfer gate implant 705 insuring optimum separation 160 (~0.3 microns to 0.5 microns) between the higher doped NMOS p-well Edge 708 and the lower doped TDBI 705. Thus separation refers to the implantation areas. After thermal processing steps, the implanted dopants diffuse closer, shrinking or eliminating the gap.
   In our innovation adjustable voltages of increased absolute potential are also provided for the gate of the reset transistor. This insures that the sense node potential can be reset to the power supply voltage of the chip to insure maximum pixel capacity.
   These two different devices with different functions and required doping profiles of silicon impurities are integrated to be in very close proximity to support pixel scaling.
   However, in shared pixel designs this approach affords room to use a more conventional NMOS p-well for the transfer gate device. There is sufficient room for the NMOS device p-well edge to be separated from the Right edge of the Transfer device.
   The high concentration of the p-well for NMOS transistors has decreased to within ½ order (about a factor of 3.2) of the wafer background doping before reaching regions of TDBI doping.

Figure 15:
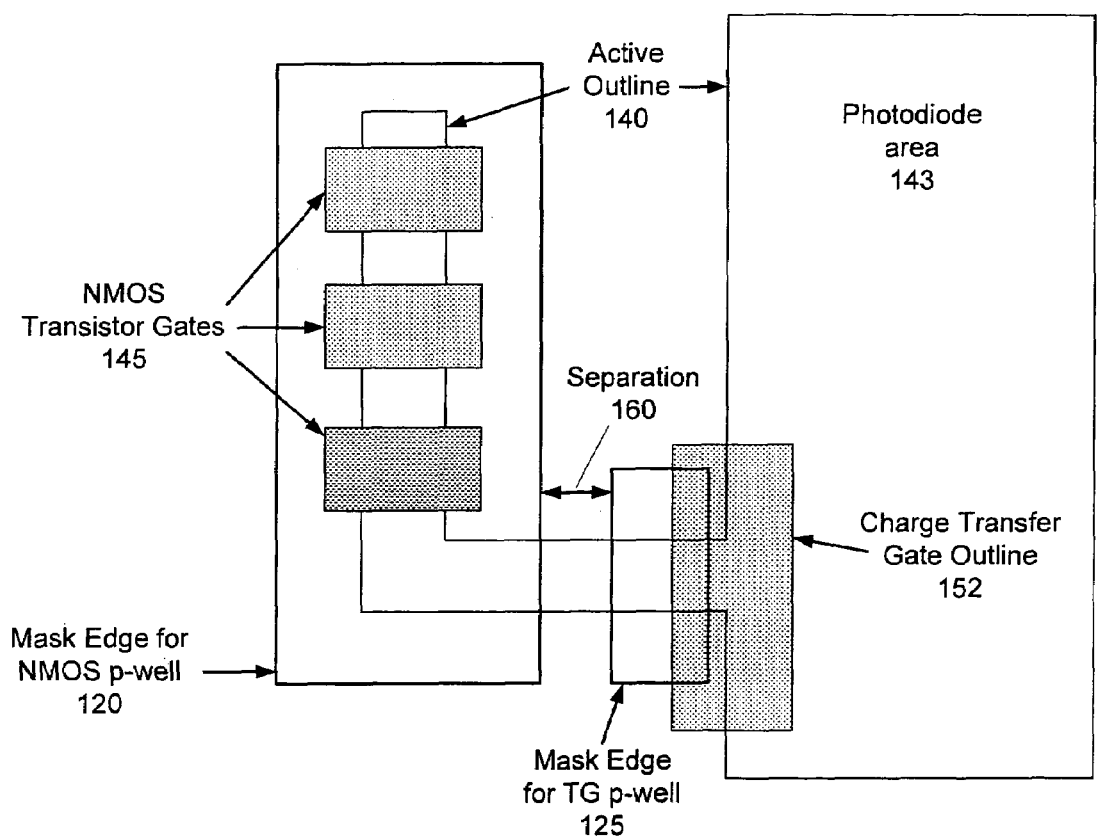
FIG. 15 is a plan view schematic of a pixel with a separation between the transfer device barrier implant and the reset transistor p-well implant, and an overlap of the transfer device barrier implant with the transfer gate.

2) Transfer Device Barrier Control Boron Implant
   Boron implant for control of barrier potential for charge transfer from floating diffusion node/reset node with the following features:
   Implant is not centered on the channel formed by the intersection of the transfer gate poly and active but is moved away from the n-type photodiode region. The shift is determined by the charge transfer operation. For one embodiment, the TDBI overlaps with the TG by 0.2 um. (FIG. 14). The top view of the layout for the non-shared embodiment of the pixel is shown in FIG. 15. Charge transfer occurs at the floating node edge of the transfer gate, very close to the silicon surface. This shift insures the best barrier properties to transfer the charge.

FIG. 14 is a cross-sectional schematic of a pixel. The pixel is formed in a <100> substrate 700 with a p-type doping of $5 \times 10^{14}$ cm$^{-1}$. Shallow trench isolation 702 separates a photodiode formed from implants (N-type deep implant 715 and N-type ring implant 712) from an adjacent photodiode 790. There is a separation between the transfer device barrier implant 705 and the reset transistor p-well 716 (in this example, with a separation of about 0.3 um-0.5 um), and an overlap of the transfer device barrier implant 705 with the transfer gate 717 (in this example, with an overlap of about 0.2 um). The transfer gate 717 also overlaps the floating diffusion 720 and the photodiode. The transfer gate 717 is aligned with the p+ pinning implant 723. The floating diffusion 720 is formed to be positioned partly in the transfer device barrier implant 705 and partly in the reset transistor p-well 716. The reset gate 716 overlaps the n+ floating diffusion 720 and the n+ RD 730.

FIG. 15 is a plan view schematic of a pixel. The pixel is formed with a separation 160 between the transfer device barrier implant 125 and the reset transistor p-well implant 120, and an overlap of the transfer device barrier implant 125 with the transfer gate 152. Also shown are NMOS transistor gates 145, photodiode area 143, and active outline 140.

TDBI doping is process dependent, for example boron with dose and energy in the range of 1e12, 40 keV to 5e13, 250 keV.

The Doping level for the barrier is optimized in concert with the implants for the photodiode n type region to insure optimum capacity, built in anti-blooming control, and full charge transfer to insure true CDS and low noise.

3) Ring and Core Implants for n-type photo collection region. (Photodiode area)
   The capacity and charge transfer and noise are optimized in CMOS integration through the use of two implants to define the n-type area and ensure optimum integration into CMOS.

A low dose phosphorous implant with dose in the range of 1e12 to 1e13 and energy in the range of 200 keV to 37 keV.

This phosphorous implant provides optimum depth for the photodiode electric field to ensure low cross talk and high collection of red light.

A second ring-shaped phosphorous implant (FIG. 16) is placed around the perimeter of the device and in intimate contact with the transfer channel implant to maximize the capacity of the pixel in a CMOS context while providing a favorable electric field. This concept is used in conjunction with the TDBI and p-well isolation in CMOS with STI. The width of this implant is determined in one embodiment as about 0.5 um. The effect of this implant starts to disappear as it becomes narrower. The misalignment and control of the width also become more difficult. If it is laid out wider, the maximum of the potential becomes flatter and shifts towards the PD center.

Figure 16:
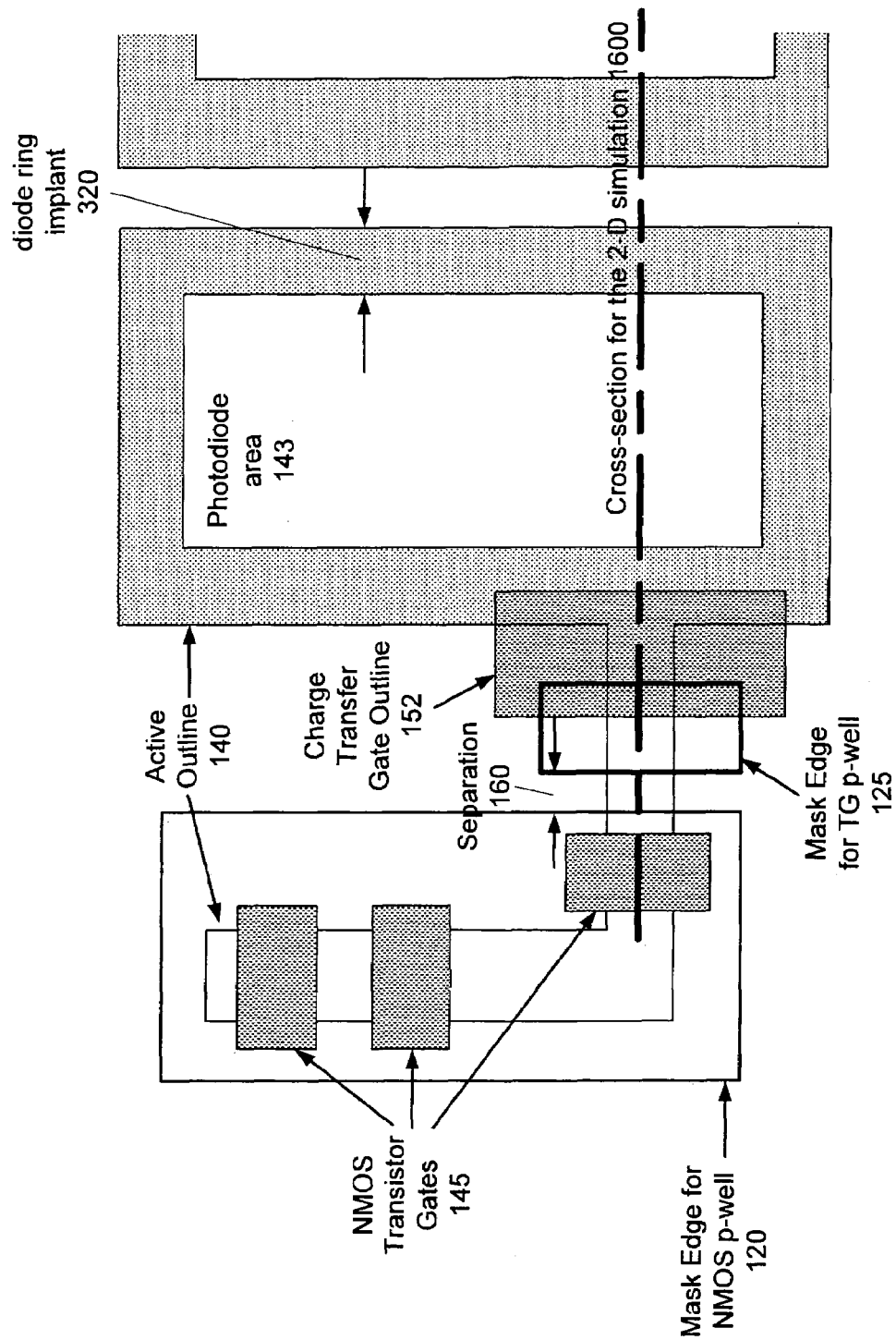
FIG. 16 is a plan view schematic of a pixel with an n-type diode ring implant and showing the cross-section for the 2D simulation.

FIG. 16 is a plan view schematic of a pixel, similar to FIG. 15. The photodiode area 143 is characterized by an n-type diode ring implant 320. Cross-section 1600 for the 2D simulation is indicated.

Best dose and energy for the phosphorous ring implant is in the range of 5e11 to 1e13 and 50 keV to 250 keV.

Figure 31:
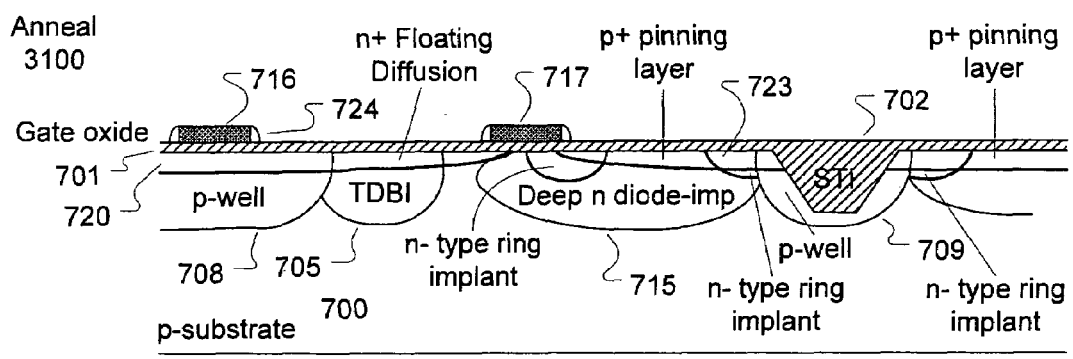
FIG. 31 illustrates part of a pixel fabrication process and shows the annealing.
Figure 32:
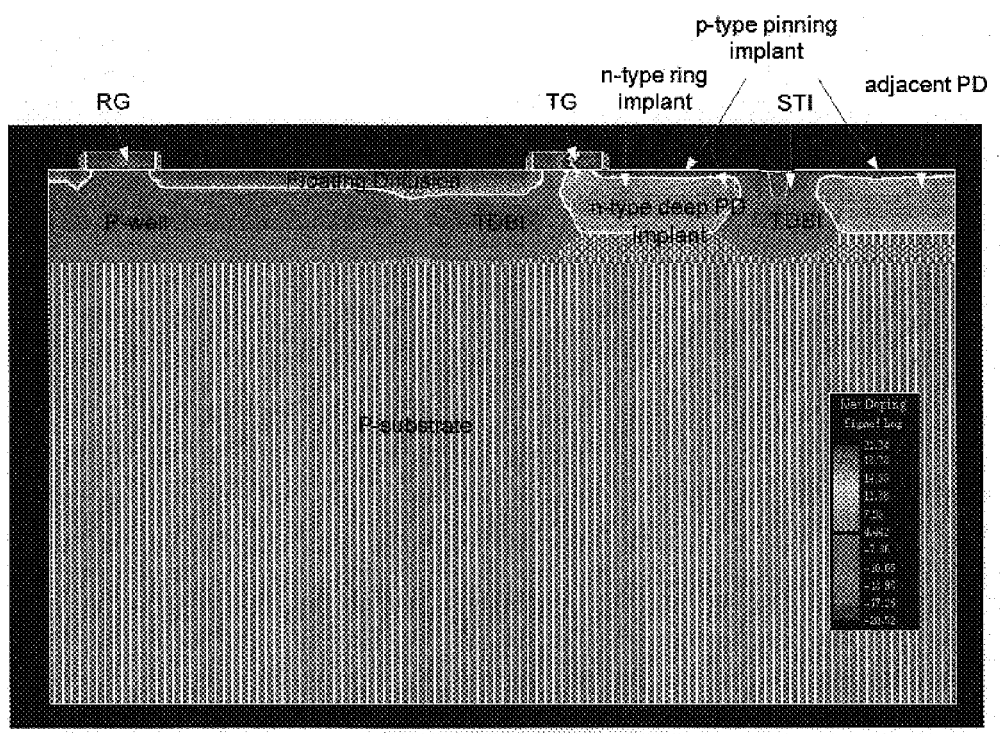
FIG. 32 shows a simulation of a cross-section a pixel with the reset transistor, transfer gate, and photodiode.

The optimum dose and energy for the Phosphorous implant is determined by process and device simulations as explained in the design methodology. Cross-sectional view is shown in FIG. 32. The fabrication process is shown in FIGS. 17-31.

Figure 17:
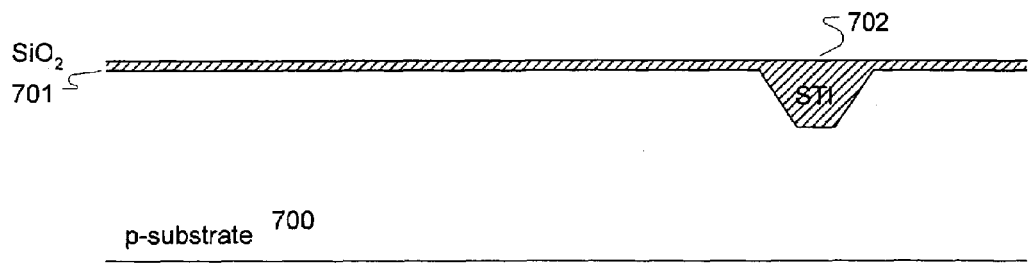
FIG. 17 illustrates part of a pixel fabrication process and shows a cross-sectional view of a pixel with shallow trench isolation.
Figure 18:
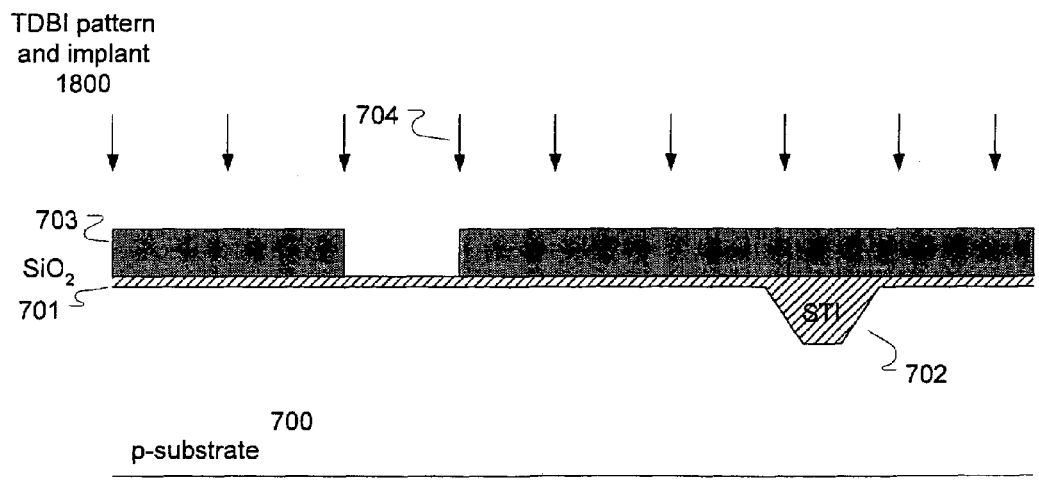
FIG. 18 illustrates part of a pixel fabrication process and shows the patterning and implantation of the transfer device barrier implant.
Figure 19:
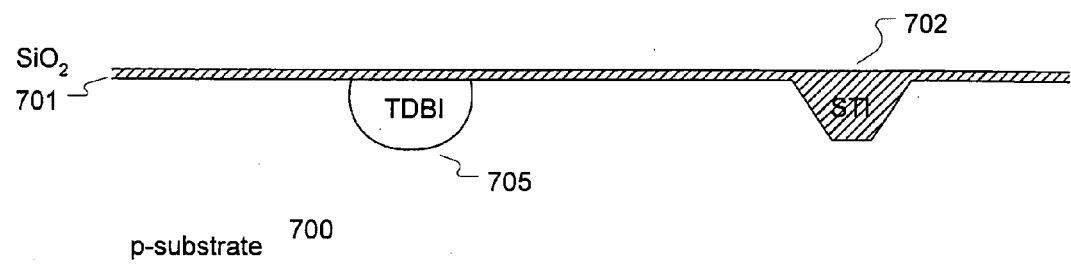
FIG. 19 illustrates part of a pixel fabrication process and shows the transfer device barrier implant.

In FIG. 17, shallow trench isolation 702 and SiO$_2$ 701 are formed on p-type substrate 700. FIG. 18 shows the patterning 703 and implantation 704 of the transfer device barrier implant. FIG. 19 shows the transfer device barrier implant 705.

Figure 20:
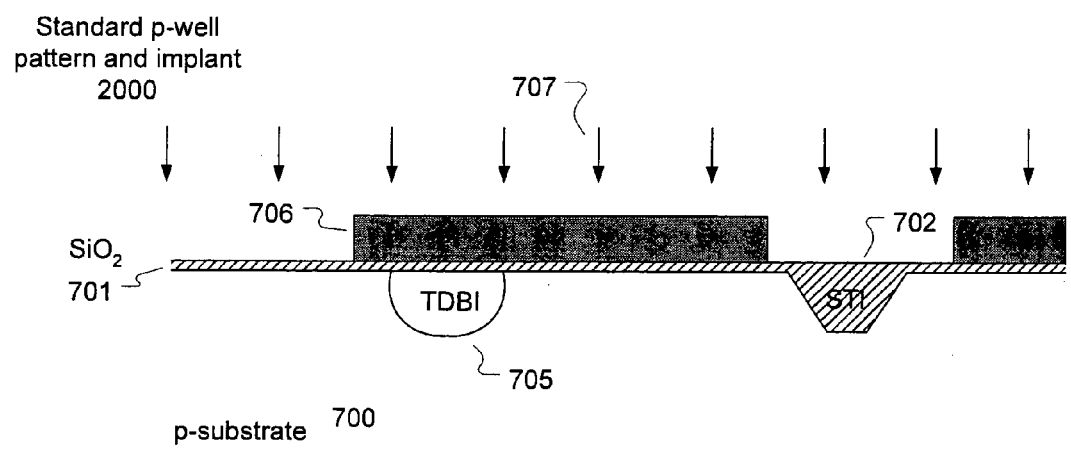
FIG. 20 illustrates part of a pixel fabrication process and shows the patterning and implantation of a typical p-well implant.
Figure 21:
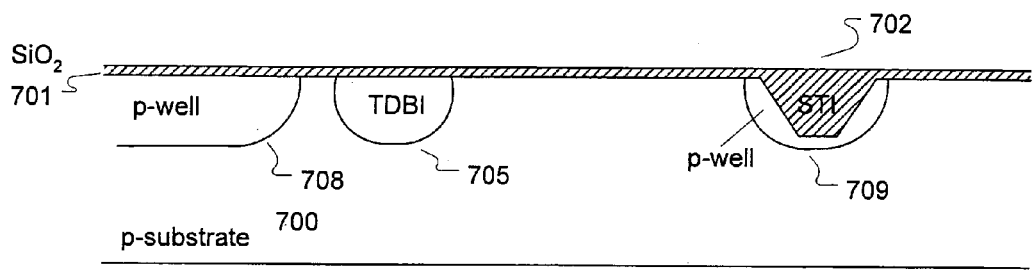
FIG. 21 illustrates part of a pixel fabrication process and shows the p-well implant for the signal and reset transistors and isolation of neighboring photodiodes.

FIG. 20 shows the patterning 706 and implantation 707 of a typical p-well implant. FIG. 21 shows the p-well implant 708 for the signal and reset transistors and isolation 709 of neighboring photodiodes.

Figure 22:
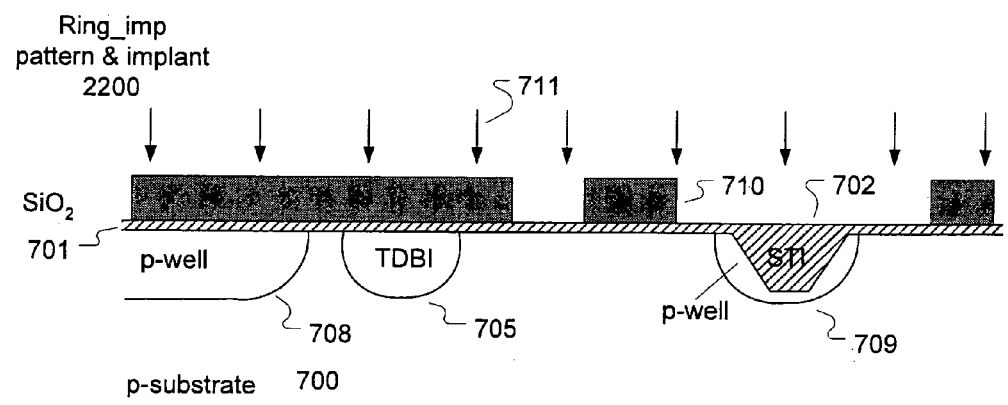
FIG. 22 illustrates part of a pixel fabrication process and shows the patterning and implantation of the photodiode ring implant.
Figure 23:
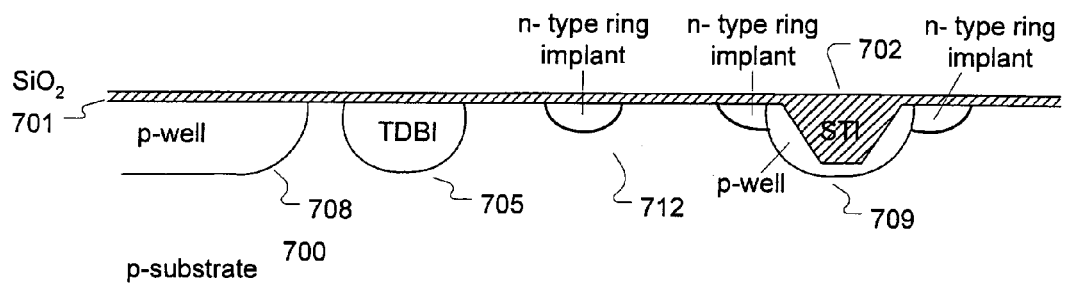
FIG. 23 illustrates part of a pixel fabrication process and shows the photodiode ring implant.

FIG. 22 shows the patterning 710 and implantation 711 of the photodiode ring implant. FIG. 23 shows the photodiode ring implant 712.

Figure 24:
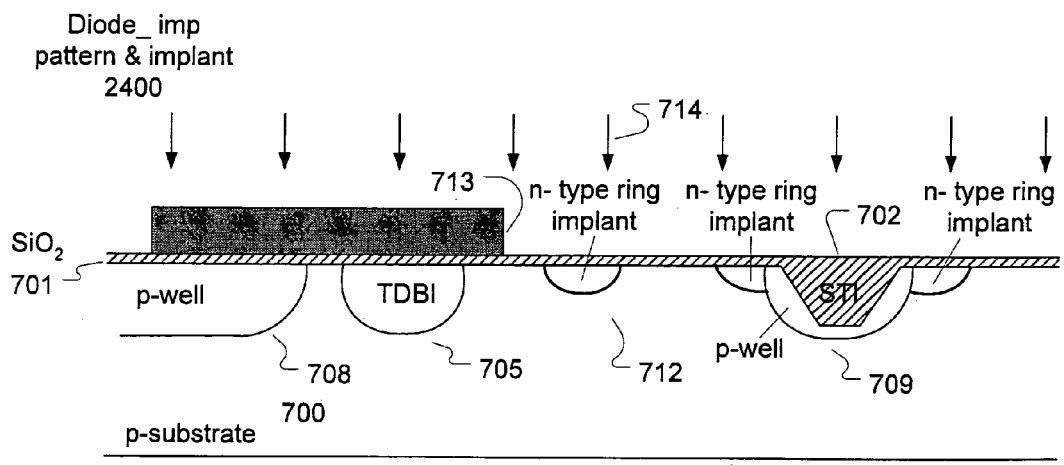
FIG. 24 illustrates part of a pixel fabrication process and shows the patterning and implantation of the photodiode deep implant.
Figure 25:
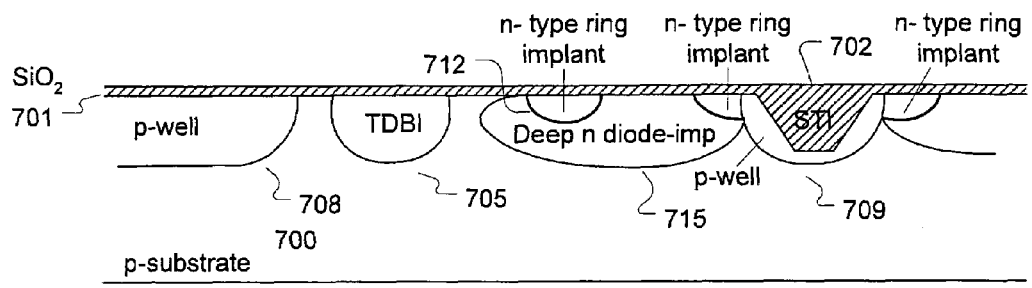
FIG. 25 illustrates part of a pixel fabrication process and shows the photodiode deep implant.

FIG. 24 shows the patterning 713 and implantation 714 of the photodiode deep implant. FIG. 25 shows the photodiode deep implant 715.

Figure 26:
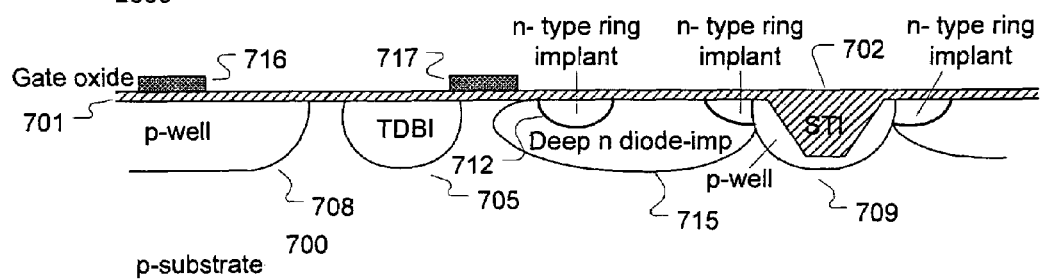
FIG. 26 illustrates part of a pixel fabrication process and shows the patterning and growth of the gate oxide and patterning and deposition of the polysilicon gates.

FIG. 26 shows the patterning and growth of the gate oxide and patterning and deposition of the polysilicon gates 716 and 717.

Figure 27:
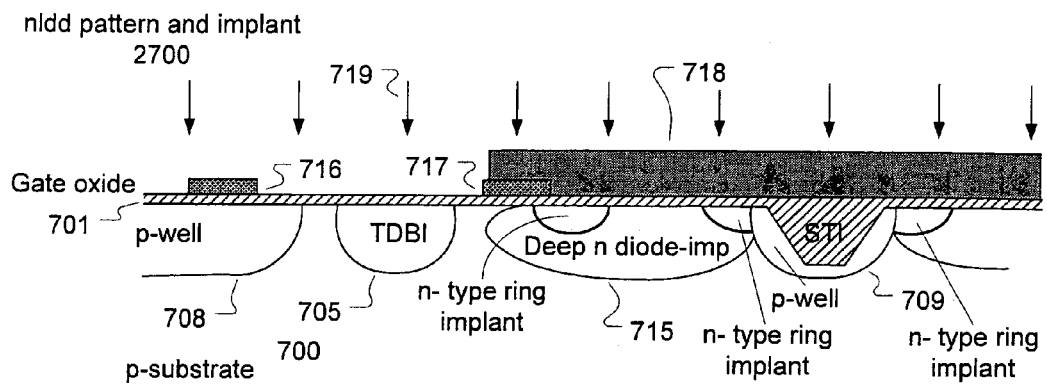
FIG. 27 illustrates part of a pixel fabrication process and shows the patterning and implantation of the nldd, or floating node.
Figure 28:
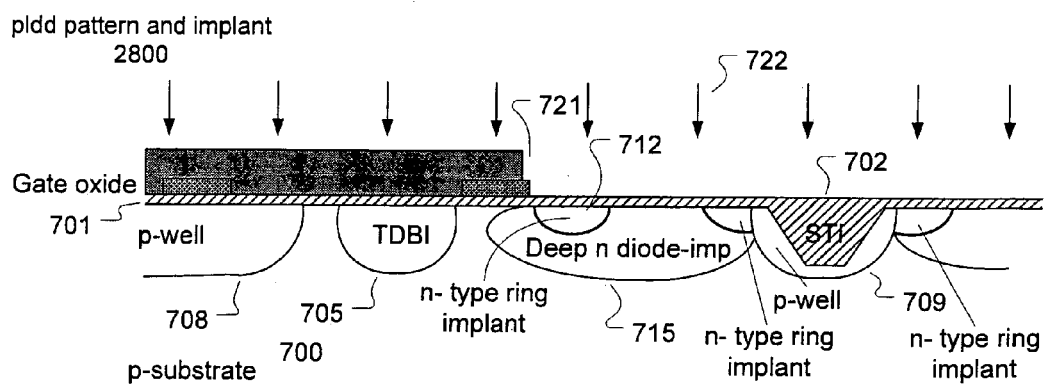
FIG. 28 illustrates part of a pixel fabrication process and shows the patterning and implantation of the pldd, or pinning implant.
Figure 29:
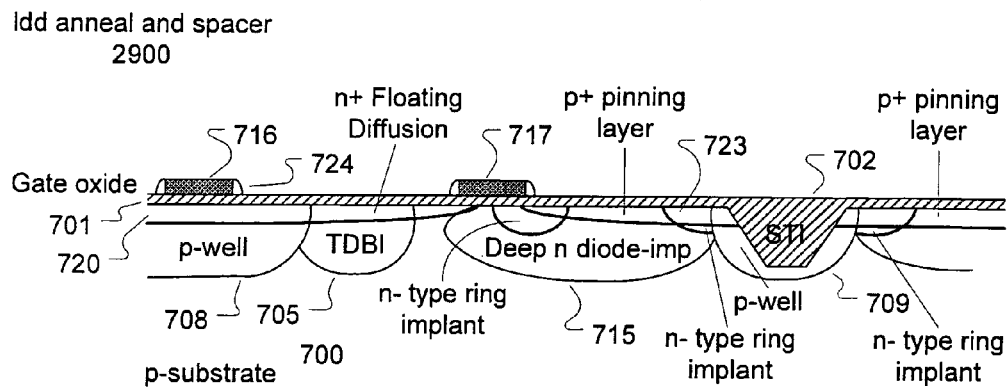
FIG. 29 illustrates part of a pixel fabrication process and shows annealing and the growth of the transistor spacers.

FIG. 27 shows the patterning 718 and implantation 719 of the nldd, or floating node. FIG. 28 shows the patterning 721 and implantation 722 of the pldd, or pinning implant. FIG. 29 shows annealing (The nldd or n+ floating diffusion 720 and the pldd or p+ pinning layer 723 are shown) and the growth of the transistor spacers 724.

Figure 30:
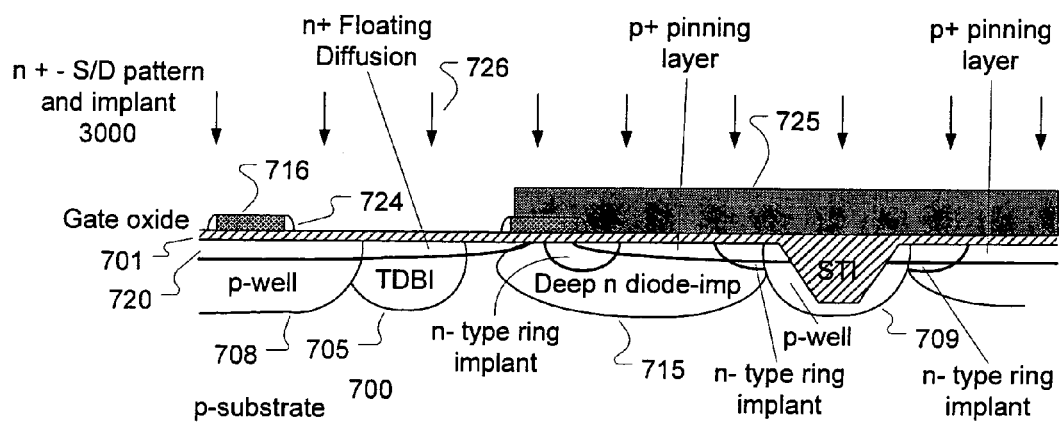
FIG. 30 illustrates part of a pixel fabrication process and shows the patterning and implantation of the sources and drains of the transistors.

FIG. 30 shows the patterning 725 and implantation 726 of the sources and drains of the transistors. FIG. 31 shows the annealing.

4) Work Function Control of Transfer Device Gate

The barrier of the transfer gate is optimized by using a polycrystalline silicon gate with a more p-type work function, resulting in improved properties. This increase in barrier properties allows improved overall performance when combined with a voltage boost on the transfer gate during the on state. The higher work function makes the off state more "OFF" without the use of higher doping levels and attracts holes to the silicon surface under the TG (pinning), reducing dark current via electron-hole recombination. The increased barrier can then be easily overcome by a controlled voltage applied to the transfer gate during the on or charge transfer state.

There is also a significant reduction of the dark current by using a pinned PD rather than a normal pn diode. The pinned PD keeps the surface accumulated by holes, and therefore any electron that becomes free due to surface interface states recombines with the hole immediately, and the dark current is eliminated. The silicon under the TG area with the existing structure remains depleted during operation. This area still contributes to dark current generation which can be eliminated by changing the poly doping to p-type.

The TG in some embodiments uses an n-type poly. With typical operating voltages of the CMOS process, the area under the TG remains depleted and generates dark current.

There are other solutions to this problem such as applying a negative voltage to the TG and attracting holes to the surface while the gate is OFF. This requires additional negative bias voltage which is more complex to create and manage.

Using p-type poly gate instead of n-type poly gate for the TG: The work-function difference between the p-type poly to the substrate acts like negative biasing and attracts holes to the surface. By making the TG polycrystalline silicon p-type, the dark current generation under the TG is eliminated during the charge collection period.

The work function of the gate can also be sloped to be non-constant with the work function over the n-type area being more p-type than the work function over/near the sense node.

A charge transfer device with a more p-type work function is achieved by: blocking n-type doping normally applied to NMOS type devices, and/or applying p-type doping which is also used for surface pinning, and/or adding additional p-type implants such as a special o-type implant, PLDD or p+ implant.

One embodiment for small pixels dopes the poly p-type with a special mask after polycrystalline silicon deposition and before patterning. Suitable polycrystalline silicon etch should be obtained with the p-type doping present in the CMOS process baseline.

Figure 33:
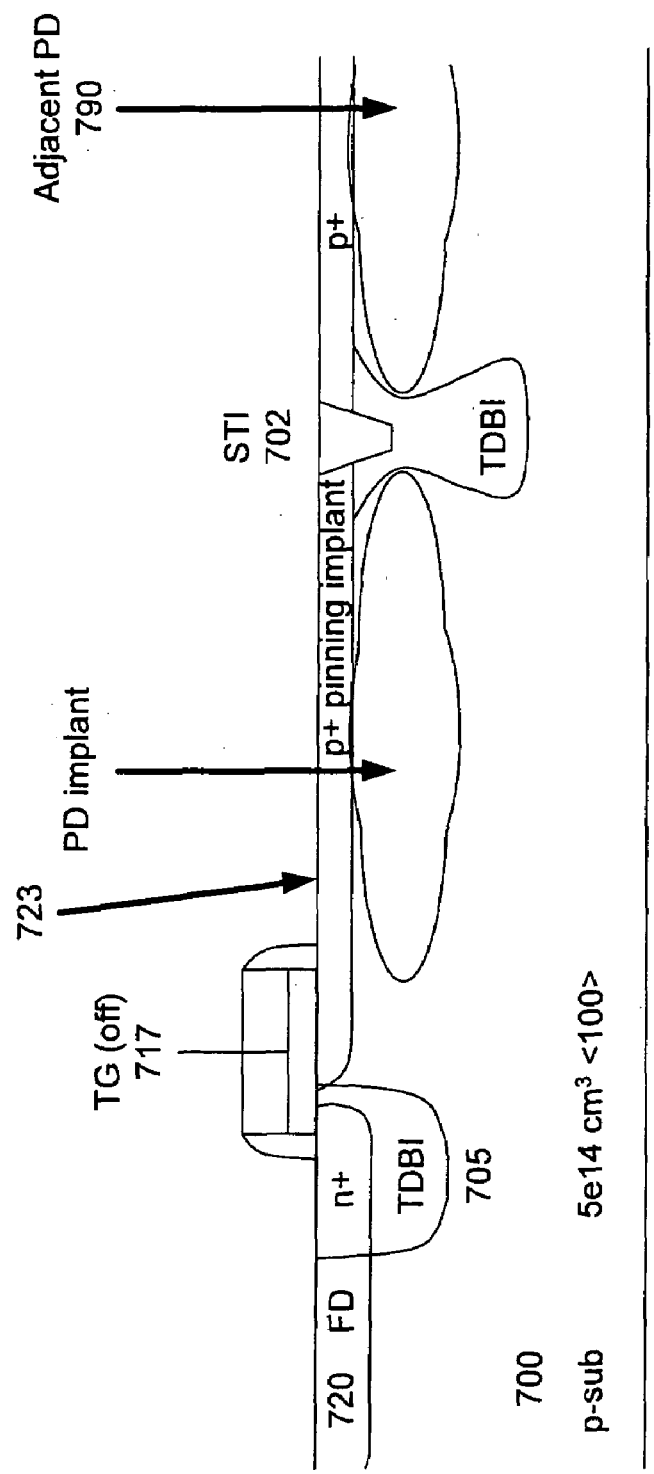
FIG. 33 is a cross-sectional schematic of a pixel with a p-type polysilicon gate for the transfer gate.

FIG. 33 illustrates the p-type poly TG 717 and the silicon under the gate while it is on OFF state. The charge integration period is usually much longer than the charge transfer period. Thus, pinning the silicon under TG will eliminate the dark current generation in this region almost completely. This region will be in depletion only for a short period of time during charge transfer. The dark current generation during this time is negligible.

5) Adaptive Circuitry—Blooming Control—Incomplete Charge Transfer

Blooming Control during charge integration: Because the transfer gate's voltage is variable, it can be used for blooming control during charge integration. If there is excessively bright light, there will be excess charge in the PD. This excess charge should rather be drained to the floating diffusion node of the same pixel rather than cause blooming to occur in the neighboring pixels. If the light level is so high that there will be blooming in the adjacent pixels, the TG voltage should be lowered, to enable the excess charge to flow to the floating diffusion node easily. This voltage is variable and can be adjusted to the desired level by the on-chip adaptive circuitry. (FIG. 5)

Charge Transfer: The same gate voltage is used differently, in the case of incomplete charge transfer from the PD to the floating diffusion during the charge transfer period. The TG voltage should be increased by an on-chip charge pump. The charge pump provides voltages at least a threshold voltage of the n-type MOS transistor (VT) above the supply voltage or higher. This gate operates under a strong backbias condition. Therefore, it can handle relatively high voltages. This feature provides extra margin for the charge transfer. (FIG. 8).

6) Optimization of Starting Material

Optimum integration of the advanced pixel occurs when the CMOS starting material is chosen to be low doped p on p+ epi. The use of p+ epi eliminates latch up concerns that might otherwise arise from any significant change in the substrate concentration.

The doping level should be as low as practical with acceptable control in the manufacturing process and is recommended to be in the range of 2E14 to a maximum of 1E15. This low doping allows the best optimization of the charge transfer and allows the electric fields for charge collection to extend as deeply as possible into the silicon. One embodiment has about 4E14 Boron doping.

The thickness of the lightly doped surface layer should be optimized to allow the best possible light collection. The choice of a thick epi layer improves light collection for the red but increases cross talk and increases the potential for latch up. Use of a thin layer will interfere with CMOS n-well and p-well doping and results in reduced light collection in the red.

The optimum EPI thickness is in the range of 4 to 7 microns. (FIG. 34).

Figure 34:
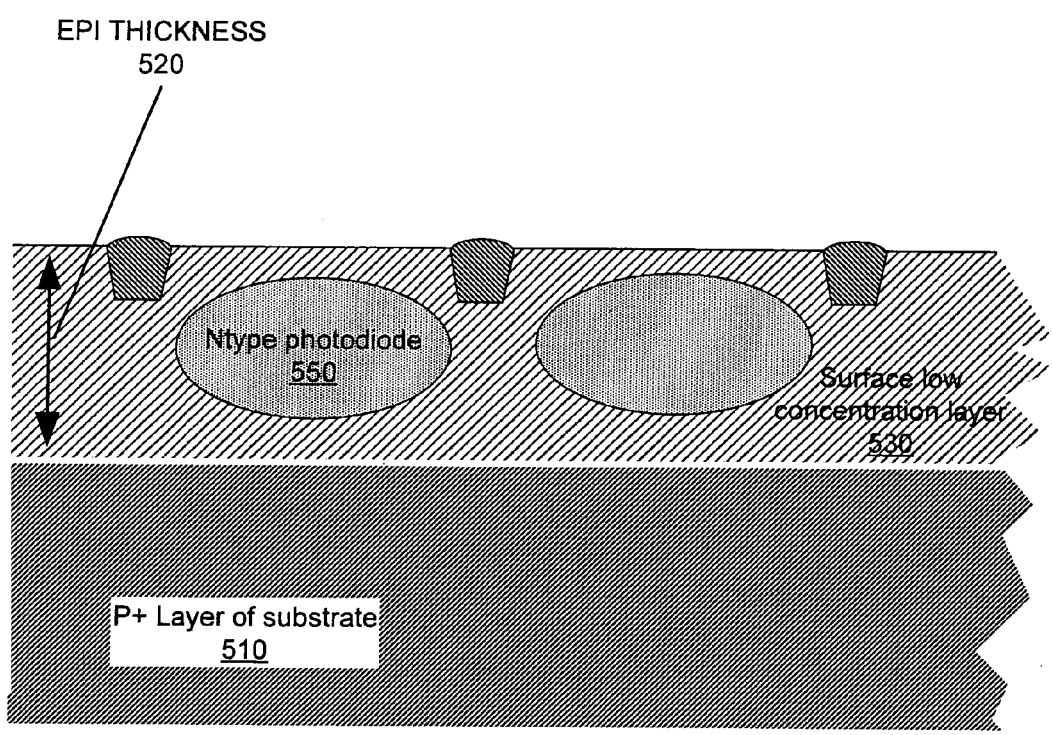
FIG. 34 is a cross-sectional schematic of a photodetector of a pixel showing the p+ epitaxial layer.

FIG. 34 is a cross-sectional schematic of a photodetector of a pixel. The p+ epitaxial layer having a low concentration layer 530 having a thickness 520 is formed on p+ layer of substrate 510. The N-type photodiode 550 is formed in the layer 530.

7) Pixel Layout

Figure 35:
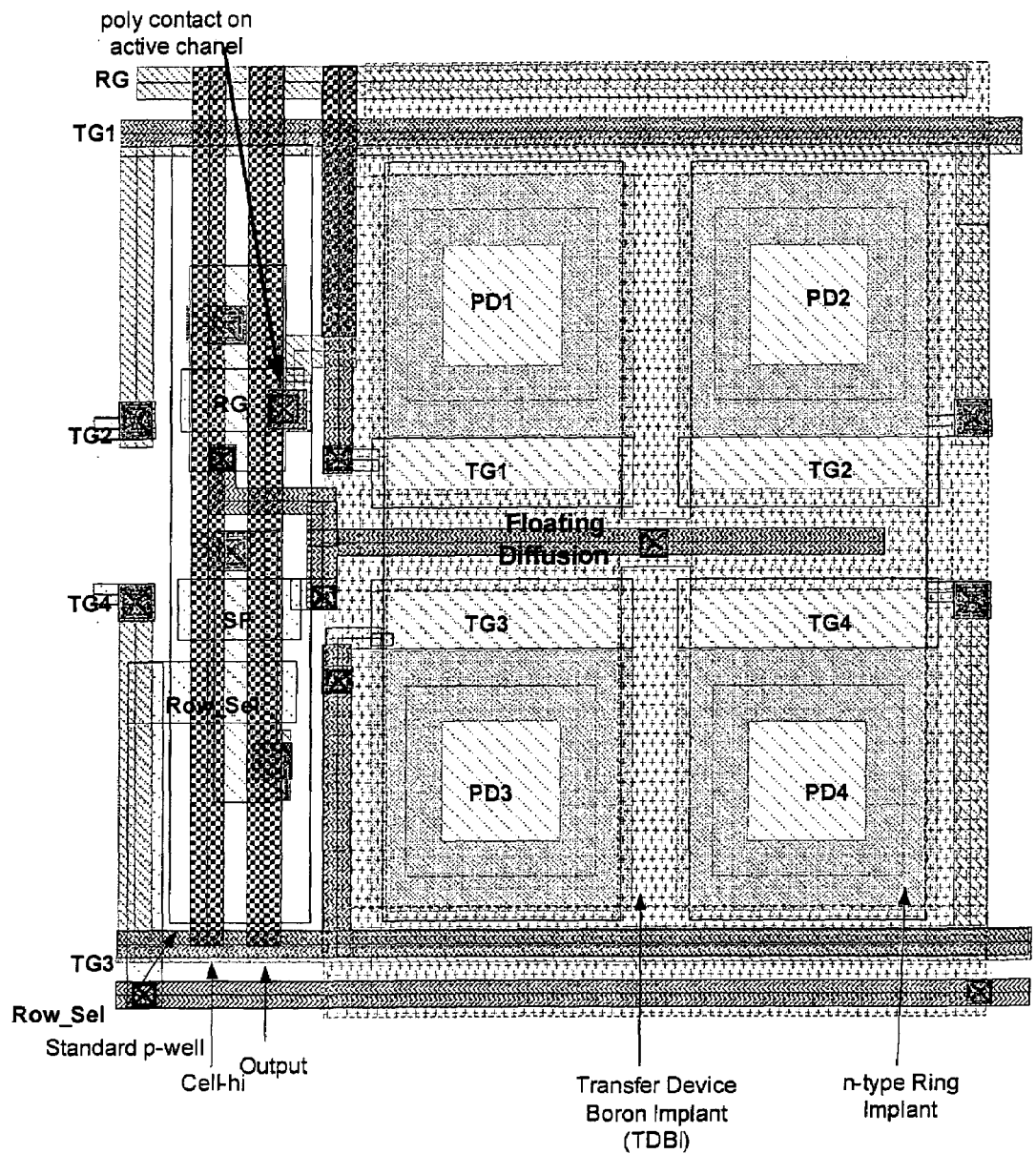
FIG. 35 is an example layout of several pixels that share circuitry such as the floating node, reset transistor, and signal transistors.

Contacts to polysilicon that are over the active channel are shown in FIG. 35. The placement of contacts over the pixel channel allows the pixel layout to be smaller with a higher fill factor and better performance.

8) Dark current reduction through use of PLDD implant to isolate the photodiode from the surface states.

The use of the PLDD implant as the p-type surface pinning implant saves one mask and works well. This implant pins the surface to the most negative voltage in the device and keeps the surface accumulated by holes. In addition, as explained above, the region under the TG can be pinned by doping this gate p-type. This region is depleted only during charge transfer period, which is typically much shorter than the charge integration period. Thus, the PD surface is pinned, and the dark current generation is eliminated.

9) Correlated Double Sampling (CDS) and Very Low Noise improve low-light performance.

Due to surface pinning in the PD, the dark current shot noise becomes very low. The other major noise component is the kTC noise in the pixel. With the 3 transistor pixels, a true CDS cannot be done. Embodiments of the pixel design enable a true CDS by holding the charge isolated in the PD region. The FD potential is sampled twice, before and after the charge transfer. The difference of these levels is due to the signal integrated in the PD. Subtracting the signal level from reset level eliminates the kTC noise.

As the noise level is reduced the low-light performance of the imager is improved. This is very important for the digital still camera applications.

10) Shared Pixel Architecture

The shared pixel schematic is shown in FIG. 2, and layout in FIG. 35. This pixel works fine in a single pixel architecture. However, it is also very suitable for a shared architecture because the transfer gates can be laid out very symmetrically and be surrounded by the TDBI, while the reset gate, source-follower and row-select transistors are laid out in the p-well next to the photodiodes. It becomes also very simple to lay out the deep PD n-implant and p+-pinning implant to cover all 4 PDs at once.

When the charge integration period is over, the TGs turn ON one by one, transferring the charge from the PD to the floating diffusion node. The charge transfer occurs in the vertical direction for all the PDs and is very symmetrical. The TGs are laid out as very simple gate structures to avoid 3D effects, especially caused by corners. The accumulated charge does not need to turn any corners and change direction with this layout, and flows vertically in one dimension.

The four PDs in the shared architecture are surrounded by the TDBI for isolation. The TDBI is also used as a barrier layer between them. The active devices (Reset transistor, Source Follower and Row-select transistors) are laid out in the p-well.

The layout becomes more efficient by putting all the PDs together and isolating them with the TDBI, and sharing the active transistors that are laid out in the p-well.
About 30% . . . 40% higher fill factor is achieved compared to single pixel architecture.

Figure 36:
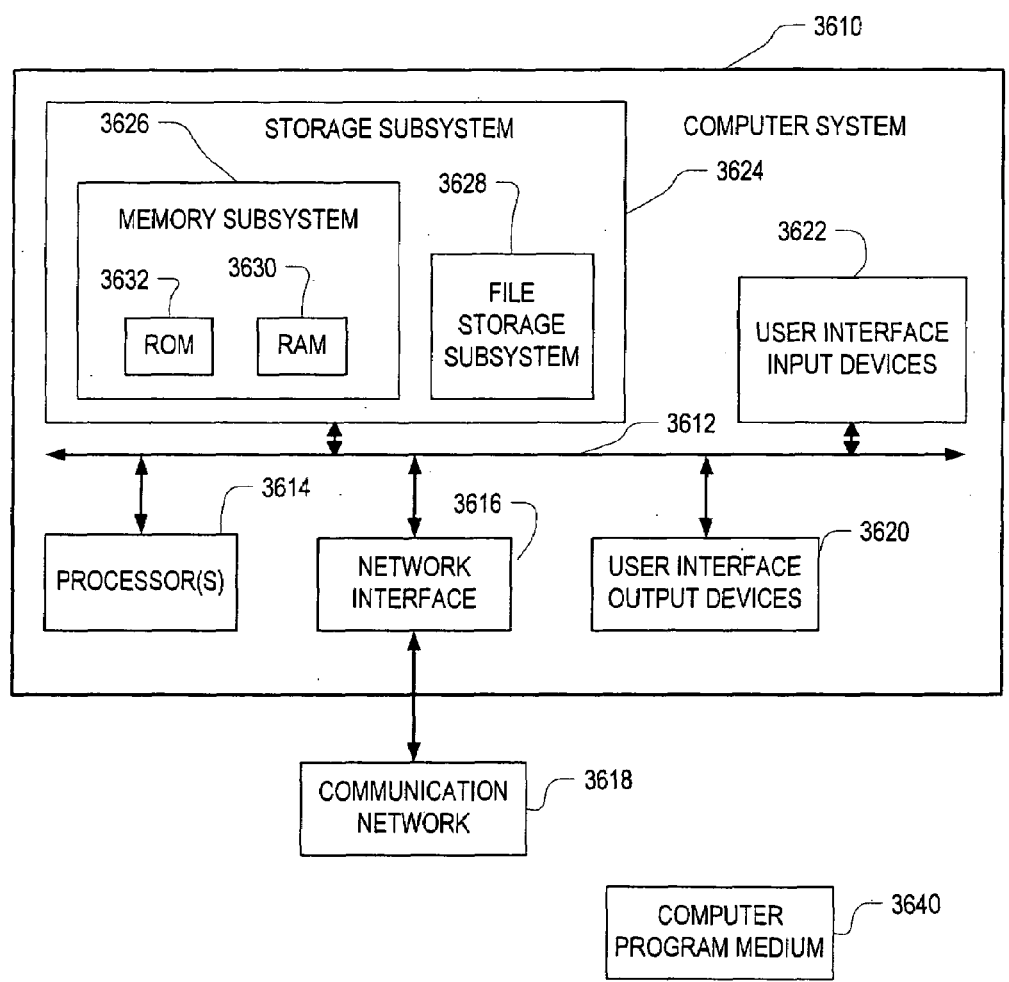
FIG. 36 is an exemplary computer apparatus and computer code medium.

FIG. 36 is a simplified block diagram of a computer system 3610 suitable for use with embodiments of the present invention. Computer system 3610 typically includes at least one processor 3614 which communicates with a number of peripheral devices via bus subsystem 3612. These peripheral devices may include a storage subsystem 3624, comprising a memory subsystem 3626 and a file storage subsystem 3628, user interface input devices 3622, user interface output devices 3620, and a network interface subsystem 3616. The input and output devices allow user interaction with computer system 3610. Network interface subsystem 3616 provides an interface to outside networks, including an interface to communication network 3618, and is coupled via communication network 3618 to corresponding interface devices in other computer systems. Communication network 3618 may comprise many interconnected computer systems and communication links. These communication links may be wireline links, optical links, wireless links, or any other mechanisms for communication of information. While in one embodiment, communication network 3618 is the Internet, in other embodiments, communication network 3618 may be any suitable computer network.

User interface input devices 3622 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 3610 or onto computer network 3618.

User interface output devices 3620 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 3610 to the user or to another machine or computer system.

Storage subsystem 3624 stores the basic programming and data constructs that provide the functionality of certain embodiments of the present invention. For example, the various modules implementing the functionality of certain embodiments of the invention may be stored in storage subsystem 3624. These software modules are generally executed by processor 3614.

Memory subsystem 3626 typically includes a number of memories including a main random access memory (RAM) 3630 for storage of instructions and data during program execution and a read only memory (ROM) 3632 in which fixed instructions are stored. File storage subsystem 3628 provides persistent storage for program and data files, and may include a hard disk drive, a floppy disk drive along with associated removable media, a CD-ROM drive, an optical drive, or removable media cartridges. The databases and modules implementing the functionality of certain embodiments of the invention may be stored by file storage subsystem 3628.

Bus subsystem 3612 provides a mechanism for letting the various components and subsystems of computer system 3610 communicate with each other as intended. Although bus subsystem 3612 is shown schematically as a single bus, alternative embodiments of the bus subsystem may use multiple busses.

Computer program medium 3640 can be a medium associated with file storage subsystem 3628, and/or with network interface 3616. The computer program medium can be an optical, magnetic, and/or electric medium that stores circuit data such as a layout, a tapeout, or other design data.

Computer system 3610 itself can be of varying types including a personal computer, a portable computer, a workstation, a computer terminal, a network computer, a television, a mainframe, or any other data processing system or user device. Due to the ever-changing nature of computers and networks, the description of computer system 3610 depicted in FIG. 36 is intended only as a specific example for purposes of illustrating the preferred embodiments of the present invention. Many other configurations of computer system 3610 are possible having more or less components than the computer system depicted in FIG. 36.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An image sensor integrated circuit, comprising:
   a plurality of photodetectors generating electrons excited by incident photons;
   a plurality of nodes, wherein each of the plurality of photodetectors has a corresponding node of the plurality of nodes;
   a plurality of transfer devices controlling a transfer of the electrons from said each of the plurality of photodetectors to the corresponding node, the transfer depending on a control signal applied to the plurality of transfer devices;
   a plurality of reset devices, wherein each of the plurality of nodes has a corresponding reset device of the plurality of reset devices, and said each of the plurality of nodes is reset when the corresponding reset device is active;
   row and column circuitry;
   a plurality of signal devices coupling the plurality of nodes to the row and column circuitry; and
   variable voltage circuitry including a voltage selector determining a control voltage of the control signal applied to the plurality of transfer devices.

2. The circuit of claim 1, wherein the voltage selector is controlled by a fuse.

3. The circuit of claim 1, wherein the voltage selector is controlled by a register.

4. The circuit of claim 1, wherein the variable voltage circuitry includes a second voltage selector determining a second control voltage of a second control signal applied to the plurality of reset devices.

5. The circuit of claim 1, wherein the control signal is generated on circuitry separate from the image sensor integrated circuit.

6. The circuit of claim 1, wherein the voltage circuitry further comprises a digital to analog converter generating the control signal on the image sensor integrated circuit.

7. The circuit of claim 1, wherein the variable voltage circuitry includes a waveform adjustor.

8. The circuit of claim 1, wherein the variable voltage circuitry includes a waveform adjustor determining a rise time and a fall time of the control signal applied to the plurality of transfer devices.

9. The circuit of claim 1, further comprising:
   a plurality of p-type regions isolating neighboring photodetectors from each other.

10. The circuit of claim 1, wherein each of the plurality of transfer devices includes a first terminal, a second terminal, a body connecting the first terminal and the second terminal, a control terminal controlling the transfer of the electrons between the first terminal and the second terminal through the body, and a dielectric between the control terminal and the body, the dielectric satisfying a lifetime specification of the image sensor integrated circuit when the control signal is applied with the channel formed, the dielectric failing the lifetime specification of the image sensor integrated circuit if the control signal is applied with at least one of the first terminal and the second terminal at a ground voltage of the image sensor integrated circuit.

11. The circuit of claim 1, wherein the plurality of signal devices includes a plurality of row select transistors coupled to the row and column circuitry and a plurality of source follower transistors coupled to the plurality of nodes.

12. The circuit of claim 1, wherein the plurality of photodetectors is a plurality of photodiodes.

13. The circuit of claim 1, wherein each measurement of the total of the photons is corrected by correlated multiple sampling with a prior measurement of the total of the photons.

14. A computer readable medium containing a description of an image sensor integrated circuit comprising:
   a plurality of photodetectors generating electrons excited by incident photons;
   a plurality of nodes, wherein each of the plurality of photodetectors has a corresponding node of the plurality of nodes;
   a plurality of transfer devices controlling a transfer of the electrons from said each of the plurality of photodetectors to the corresponding node, the transfer depending on a control signal applied to the plurality of transfer devices;

a plurality of reset devices, wherein each of the plurality of nodes has a corresponding reset device of the plurality of reset devices, and said each of the plurality of nodes is reset when the corresponding reset device is active;

row and column circuitry;

a plurality of signal devices coupling the plurality of nodes to the row and column circuitry; and variable voltage circuitry including a voltage selector determining a control voltage of the control signal applied to the plurality of transfer devices.

15. The computer readable medium of claim 14, wherein the voltage selector is controlled by a fuse.

16. The computer readable medium of claim 14, wherein the voltage selector is controlled by a register.

17. The computer readable medium of claim 14, wherein the variable voltage circuitry includes a second voltage selector determining a second control voltage of a second control signal applied to the plurality of reset devices.

18. The computer readable medium of claim 14, wherein the control signal is generated on circuitry separate from the image sensor integrated circuit.

19. The computer readable medium of claim 14, wherein the voltage circuitry further comprises a digital to analog converter generating the control signal on the image sensor integrated circuit.

20. The computer readable medium of claim 14, wherein the variable voltage circuitry includes a waveform adjustor.

21. The computer readable medium of claim 14, wherein the variable voltage circuitry includes a waveform adjustor determining a rise time and a fall time of the control signal applied to the plurality of transfer devices.

22. The computer readable medium of claim 14, further comprising:

a plurality of p-type regions isolating neighboring photodetectors from each other.

23. The computer readable medium of claim 14, wherein each of the plurality of transfer devices includes a first terminal, a second terminal, a body connecting the first terminal and the second terminal, a control terminal controlling the transfer of the electrons between the first terminal and the second terminal through the body, and a dielectric between the control terminal and the body, the dielectric satisfying a lifetime specification of the image sensor integrated circuit when the control signal is applied with the channel formed, the dielectric failing the lifetime specification of the image sensor integrated circuit if the control signal is applied with at least one of the first terminal and the second terminal at a ground voltage of the image sensor integrated circuit.

24. The computer readable medium of claim 14, wherein the plurality of signal devices includes a plurality of row select transistors coupled to the row and column circuitry and a plurality of source follower transistors coupled to the plurality of nodes.

25. The computer readable medium of claim 14, wherein the plurality of photodetectors is a plurality of photodiodes.

26. The computer readable medium of claim 14, wherein each measurement of the total of the photons is corrected by correlated multiple sampling with a prior measurement of the total of the photons.

* * * * *